United States Patent
Kurihara et al.

(10) Patent No.: US 6,525,969 B1
(45) Date of Patent: Feb. 25, 2003

(54) DECODER APPARATUS AND METHODS FOR PRE-CHARGING BIT LINES

(75) Inventors: Kazuhiro Kurihara, Sunnyvale, CA (US); Santosh K. Yachareni, Santa Clara, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 59 days.

(21) Appl. No.: 09/928,059

(22) Filed: Aug. 10, 2001

(51) Int. Cl.[7] .............................................. G11C 16/06
(52) U.S. Cl. ............................ 365/185.25; 365/185.16; 365/185.18
(58) Field of Search ....................... 365/185.16, 185.18, 365/185.25, 203

(56) References Cited

U.S. PATENT DOCUMENTS 6,134,156 A * 10/2000 Eitan ...................... 365/189.07
6,201,737 B1    3/2001 Hollmer et al.
2002/0005547 A1 * 1/2002 Hibino ........................ 257/316

* cited by examiner

*Primary Examiner*—Richard Elms
*Assistant Examiner*—VanThu Nguyen
(74) *Attorney, Agent, or Firm*—Eschweiler & Associates, LLC

(57) ABSTRACT

Methods and apparatus are disclosed for reading memory cells in a virtual ground memory core, wherein a memory cell is selected to be read and an adjacent memory cell is precharged so as to mitigate leakage current associated with the adjacent cell. Decoder circuitry and methods are disclosed for selecting the memory cell to be read and the adjacent cell to be precharged, which may be used in single bit and dual bit memory devices, and which provide drain-side or source-side current sensing in the read operation.

20 Claims, 18 Drawing Sheets

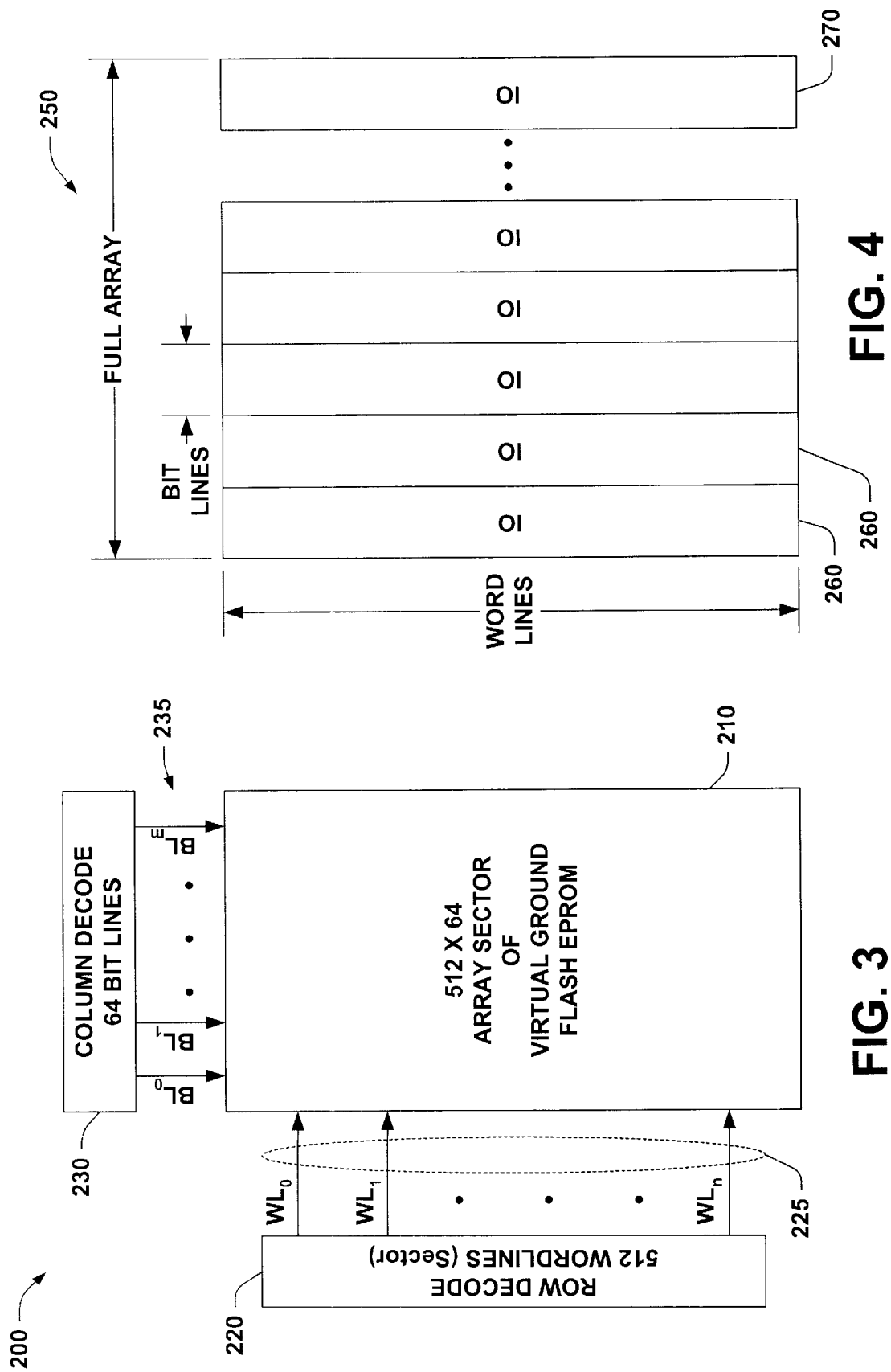

| A6 | OR A5-A3 | A2-A0 | BSDv(0) | BSDv(1) | BSDv(2) | BSDv(3) | BSDv(4) | BSDv(5) | BSDv(6) | BSDv(7) | BSDv(8) | BSG(0) | BSG(1) | BSG(2) | BSG(3) | BSG(4) | BSG(5) | BSG(6) | BSG(7) |
|---|---|---|---|---|---|---|---|---|---|---|---|---|---|---|---|---|---|---|---|
| 0 | 0 | 0 | 1 | 0 | 0 | 0 | 0 | 0 | 0 | 0 | 0 | 0 | 0 | 0 | 0 | 0 | 0 | 0 | 1 |
| | | 1 | 0 | 0 | 0 | 0 | 0 | 0 | 0 | 0 | 1 | 1 | 0 | 0 | 0 | 0 | 0 | 0 | 0 |
| | | 2 | 0 | 1 | 0 | 0 | 0 | 0 | 0 | 0 | 0 | 1 | 0 | 0 | 0 | 0 | 0 | 0 | 0 |
| | | 3 | 1 | 0 | 0 | 0 | 0 | 0 | 0 | 0 | 0 | 0 | 1 | 0 | 0 | 0 | 0 | 0 | 0 |
| | | 4 | 0 | 0 | 1 | 0 | 0 | 0 | 0 | 0 | 0 | 0 | 1 | 0 | 0 | 0 | 0 | 0 | 0 |
| | | 5 | 0 | 1 | 0 | 0 | 0 | 0 | 0 | 0 | 0 | 0 | 0 | 1 | 0 | 0 | 0 | 0 | 0 |
| | | 6 | 0 | 0 | 0 | 1 | 0 | 0 | 0 | 0 | 0 | 0 | 0 | 1 | 0 | 0 | 0 | 0 | 0 |
| | | 7 | 0 | 0 | 1 | 0 | 0 | 0 | 0 | 0 | 0 | 0 | 0 | 0 | 1 | 0 | 0 | 0 | 0 |
| | 1 | 0 | 1 | 0 | 0 | 0 | 0 | 0 | 0 | 0 | 0 | 0 | 0 | 0 | 1 | 0 | 0 | 0 | 0 |
| | | 1 | 0 | 0 | 0 | 0 | 0 | 0 | 0 | 0 | 0 | 1 | 0 | 0 | 0 | 0 | 0 | 0 | 0 |
| | | 2 | 0 | 1 | 0 | 0 | 0 | 0 | 0 | 0 | 0 | 1 | 0 | 0 | 0 | 0 | 0 | 0 | 0 |
| | | 3 | 1 | 0 | 0 | 0 | 0 | 0 | 0 | 0 | 0 | 0 | 1 | 0 | 0 | 0 | 0 | 0 | 0 |
| | | 4 | 0 | 0 | 1 | 0 | 0 | 0 | 0 | 0 | 0 | 0 | 1 | 0 | 0 | 0 | 0 | 0 | 0 |
| | | 5 | 0 | 1 | 0 | 0 | 0 | 0 | 0 | 0 | 0 | 0 | 0 | 1 | 0 | 0 | 0 | 0 | 0 |
| | | 6 | 0 | 0 | 0 | 1 | 0 | 0 | 0 | 0 | 0 | 0 | 0 | 1 | 0 | 0 | 0 | 0 | 0 |
| | | 7 | 0 | 0 | 1 | 0 | 0 | 0 | 0 | 0 | 0 | 0 | 0 | 1 | 0 | 0 | 0 | 0 | 0 |
| 1 | 0 | 0 | 0 | 0 | 0 | 0 | 1 | 0 | 0 | 0 | 0 | 0 | 0 | 1 | 0 | 0 | 0 | 0 | 0 |
| | | 1 | 0 | 0 | 0 | 1 | 0 | 0 | 0 | 0 | 0 | 0 | 0 | 0 | 1 | 0 | 0 | 0 | 0 |
| | | 2 | 0 | 0 | 0 | 0 | 0 | 1 | 0 | 0 | 0 | 0 | 0 | 0 | 0 | 1 | 0 | 0 | 0 |
| | | 3 | 0 | 0 | 0 | 0 | 1 | 0 | 0 | 0 | 0 | 0 | 0 | 0 | 0 | 0 | 1 | 0 | 0 |
| | | 4 | 0 | 0 | 0 | 0 | 0 | 0 | 1 | 0 | 0 | 0 | 0 | 0 | 0 | 0 | 1 | 0 | 0 |
| | | 5 | 0 | 0 | 0 | 0 | 0 | 1 | 0 | 0 | 0 | 0 | 0 | 0 | 0 | 0 | 0 | 1 | 0 |
| | | 6 | 0 | 0 | 0 | 0 | 0 | 0 | 0 | 1 | 0 | 0 | 0 | 0 | 0 | 0 | 0 | 1 | 0 |
| | | 7 | 0 | 0 | 0 | 0 | 0 | 1 | 0 | 0 | 0 | 0 | 0 | 0 | 0 | 0 | 0 | 0 | 1 |
| | 0 | 0 | 0 | 0 | 0 | 0 | 1 | 0 | 0 | 0 | 0 | 0 | 0 | 0 | 0 | 0 | 0 | 0 | 1 |
| | | 1 | 0 | 0 | 0 | 0 | 0 | 0 | 1 | 0 | 0 | 0 | 0 | 0 | 0 | 1 | 0 | 0 | 0 |
| | | 2 | 0 | 0 | 0 | 0 | 0 | 1 | 0 | 0 | 0 | 0 | 0 | 0 | 1 | 0 | 0 | 0 | 0 |
| | | 3 | 0 | 0 | 0 | 0 | 1 | 0 | 0 | 0 | 0 | 0 | 0 | 0 | 0 | 1 | 0 | 0 | 0 |
| | | 4 | 0 | 0 | 0 | 0 | 0 | 0 | 1 | 0 | 0 | 0 | 0 | 0 | 0 | 1 | 0 | 0 | 0 |
| | | 5 | 0 | 0 | 0 | 0 | 0 | 1 | 0 | 0 | 0 | 0 | 0 | 0 | 0 | 0 | 1 | 0 | 0 |
| | | 6 | 0 | 0 | 0 | 0 | 0 | 0 | 1 | 0 | 0 | 0 | 0 | 0 | 0 | 0 | 1 | 0 | 0 |
| | | 7 | 0 | 0 | 0 | 0 | 0 | 0 | 1 | 0 | 0 | 0 | 0 | 0 | 0 | 0 | 0 | 0 | 1 |

| A5 | A4 | A3 | A2 | A1 | CS(0) | CS(1) | CS(2) | CS(3) | CS(4) | CS(5) | CS(6) | CS(7) | CS(8) | CS(9) | CS(10) | CS(11) | CS(12) | CS(13) | CS(14) | CS(15) |
|---|---|---|---|---|---|---|---|---|---|---|---|---|---|---|---|---|---|---|---|---|
| 0 | 0 | 0 | 0 | 0 | 1 | 1 | 0 | 0 | 0 | 0 | 0 | 0 | 0 | 0 | 0 | 0 | 0 | 0 | 1 | 1 |
| 0 | 0 | 0 | 0 | 1 | 1 | 1 | 1 | 0 | 0 | 0 | 0 | 0 | 0 | 0 | 0 | 0 | 0 | 0 | 0 | 1 |
| 0 | 0 | 0 | 1 | 0 | 1 | 1 | 1 | 1 | 0 | 0 | 0 | 0 | 0 | 0 | 0 | 0 | 0 | 0 | 0 | 0 |
| 0 | 0 | 0 | 1 | 1 | 1 | 1 | 1 | 1 | 1 | 0 | 0 | 0 | 0 | 0 | 0 | 0 | 0 | 0 | 0 | 0 |
| 0 | 0 | 1 | 0 | 0 | 1 | 1 | 1 | 1 | 0 | 0 | 0 | 0 | 0 | 0 | 0 | 0 | 0 | 0 | 0 | 0 |
| 0 | 0 | 1 | 0 | 1 | 1 | 1 | 1 | 1 | 0 | 0 | 0 | 0 | 0 | 0 | 0 | 0 | 0 | 0 | 0 | 0 |
| 0 | 0 | 1 | 1 | 0 | 1 | 1 | 1 | 1 | 0 | 0 | 0 | 0 | 0 | 0 | 0 | 0 | 0 | 0 | 0 | 0 |
| 0 | 0 | 1 | 1 | 1 | 0 | 1 | 1 | 1 | 1 | 0 | 0 | 0 | 0 | 0 | 0 | 0 | 0 | 0 | 0 | 0 |
| 0 | 1 | 0 | 0 | 0 | 0 | 1 | 1 | 1 | 1 | 0 | 0 | 0 | 0 | 0 | 0 | 0 | 0 | 0 | 0 | 0 |
| 0 | 1 | 0 | 0 | 1 | 0 | 0 | 0 | 1 | 1 | 1 | 1 | 0 | 0 | 0 | 0 | 0 | 0 | 0 | 0 | 0 |
| 0 | 1 | 0 | 1 | 0 | 0 | 0 | 0 | 0 | 1 | 1 | 1 | 1 | 0 | 0 | 0 | 0 | 0 | 0 | 0 | 0 |
| 0 | 1 | 0 | 1 | 1 | 0 | 0 | 0 | 0 | 1 | 1 | 1 | 1 | 0 | 0 | 0 | 0 | 0 | 0 | 0 | 0 |
| 0 | 1 | 1 | 0 | 0 | 0 | 0 | 0 | 0 | 1 | 1 | 1 | 1 | 0 | 0 | 0 | 0 | 0 | 0 | 0 | 0 |
| 0 | 1 | 1 | 0 | 1 | 0 | 0 | 0 | 0 | 1 | 1 | 1 | 1 | 0 | 0 | 0 | 0 | 0 | 0 | 0 | 0 |
| 0 | 1 | 1 | 1 | 0 | 0 | 0 | 0 | 0 | 1 | 1 | 1 | 1 | 0 | 0 | 0 | 0 | 0 | 0 | 0 | 0 |
| 0 | 1 | 1 | 1 | 1 | 0 | 0 | 0 | 0 | 0 | 1 | 1 | 1 | 1 | 0 | 0 | 0 | 0 | 0 | 0 | 0 |
| 1 | 0 | 0 | 0 | 0 | 0 | 0 | 0 | 0 | 0 | 0 | 1 | 1 | 1 | 1 | 0 | 0 | 0 | 0 | 0 | 0 |
| 1 | 0 | 0 | 0 | 1 | 0 | 0 | 0 | 0 | 0 | 0 | 0 | 1 | 1 | 1 | 1 | 0 | 0 | 0 | 0 | 0 |
| 1 | 0 | 0 | 1 | 0 | 0 | 0 | 0 | 0 | 0 | 0 | 0 | 0 | 1 | 1 | 1 | 1 | 0 | 0 | 0 | 0 |
| 1 | 0 | 0 | 1 | 1 | 0 | 0 | 0 | 0 | 0 | 0 | 0 | 1 | 1 | 1 | 1 | 0 | 0 | 0 | 0 | 0 |
| 1 | 0 | 1 | 0 | 0 | 0 | 0 | 0 | 0 | 0 | 0 | 0 | 1 | 1 | 1 | 1 | 0 | 0 | 0 | 0 | 0 |
| 1 | 0 | 1 | 0 | 1 | 0 | 0 | 0 | 0 | 0 | 0 | 0 | 1 | 1 | 1 | 1 | 0 | 0 | 0 | 0 | 0 |
| 1 | 0 | 1 | 1 | 0 | 0 | 0 | 0 | 0 | 0 | 0 | 0 | 1 | 1 | 1 | 1 | 0 | 0 | 0 | 0 | 0 |
| 1 | 0 | 1 | 1 | 1 | 0 | 0 | 0 | 0 | 0 | 0 | 0 | 0 | 1 | 1 | 1 | 1 | 0 | 0 | 0 | 0 |
| 1 | 1 | 0 | 0 | 0 | 0 | 0 | 0 | 0 | 0 | 0 | 0 | 0 | 0 | 1 | 1 | 1 | 1 | 0 | 0 | 0 |
| 1 | 1 | 0 | 0 | 1 | 0 | 0 | 0 | 0 | 0 | 0 | 0 | 0 | 0 | 0 | 1 | 1 | 1 | 1 | 0 | 0 |
| 1 | 1 | 0 | 1 | 0 | 0 | 0 | 0 | 0 | 0 | 0 | 0 | 0 | 0 | 0 | 0 | 1 | 1 | 1 | 1 | 0 |
| 1 | 1 | 0 | 1 | 1 | 0 | 0 | 0 | 0 | 0 | 0 | 0 | 0 | 0 | 0 | 0 | 0 | 1 | 1 | 1 | 1 |
| 1 | 1 | 1 | 0 | 0 | 0 | 0 | 0 | 0 | 0 | 0 | 0 | 0 | 0 | 0 | 0 | 0 | 1 | 1 | 1 | 1 |
| 1 | 1 | 1 | 0 | 1 | 0 | 0 | 0 | 0 | 0 | 0 | 0 | 0 | 0 | 0 | 0 | 0 | 1 | 1 | 1 | 1 |
| 1 | 1 | 1 | 1 | 0 | 0 | 0 | 0 | 0 | 0 | 0 | 0 | 0 | 0 | 0 | 0 | 0 | 1 | 1 | 1 | 1 |
| 1 | 1 | 1 | 1 | 1 | 1 | 0 | 0 | 0 | 0 | 0 | 0 | 0 | 0 | 0 | 0 | 0 | 0 | 1 | 1 | 1 |

| A2 | A1 | A0 | SELv(7) | SELv(6) | SELv(5) | SELv(4) | SELv(3) | SELv(2) | SELv(1) | SELv(0) |
|---|---|---|---|---|---|---|---|---|---|---|
| 0 | 0 | 0 | 1 | 0 | 1 | 0 | 1 | 0 | 1 | 0 |
| 0 | 0 | 1 | 0 | 1 | 1 | 0 | 1 | 0 | 1 | 0 |
| 0 | 1 | 0 | 1 | 0 | 0 | 1 | 0 | 1 | 1 | 0 |
| 0 | 1 | 1 | 1 | 0 | 1 | 0 | 0 | 1 | 1 | 0 |
| 1 | 0 | 0 | 0 | 1 | 0 | 1 | 0 | 1 | 0 | 1 |
| 1 | 0 | 1 | 1 | 0 | 0 | 1 | 0 | 1 | 0 | 1 |
| 1 | 1 | 0 | 0 | 1 | 1 | 0 | 1 | 0 | 0 | 1 |
| 1 | 1 | 1 | 0 | 1 | 0 | 1 | 1 | 0 | 0 | 1 |

FIG. 13

DECODER APPARATUS AND METHODS FOR PRE-CHARGING BIT LINES

FIELD OF INVENTION

The present invention relates generally to memory systems and more particularly to decoder apparatus and methodologies for reading data from memory core cells during a memory read operation.

BACKGROUND OF THE INVENTION

Flash and other types of electronic memory devices are constructed of thousands or millions of memory cells, adapted to individually store and provide access to data. A typical memory cell stores a single binary piece of information referred to as a bit, which has one of two possible states. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry, whereby such operations may be performed on the cells within a specific byte or word. The individual memory cells are typically comprised of a semiconductor structure adapted for storing a bit of data. For instance, many conventional memory cells include a metal oxide semiconductor (MOS) device, such as a transistor in which a binary piece of information may be retained. The memory device includes appropriate decoding and group selection circuitry to address such bytes or words, as well as circuitry to provide voltages to the cells being operated on in order to achieve the desired operation.

The erase, program, and read operations are commonly performed by application of appropriate voltages to certain terminals of the cell MOS device. In an erase or program operation the voltages are applied so as to cause a charge to be stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

A typical single bit type memory cell may be programmed by applying a relatively high voltage to the control gate and a moderately high voltage to the drain, in order to produce "hot" (high energy) electrons in the channel near the drain. The hot electrons accelerate across the tunnel oxide and into the floating gate, which become trapped in the floating gate because the floating gate is surrounded by insulators. As a result of the trapped electrons, a threshold voltage of the memory cell increases. This change in the threshold voltage (and thereby the channel conductance) of the memory cell created by the trapped electrons is what causes the memory cell to be programmed.

To read the memory cell, a predetermined gate voltage greater than the threshold voltage of an unprogrammed memory cell, but less than the threshold voltage of a programmed memory cell, is applied to the gate. If the memory cell conducts (e.g., a sensed current in the cell exceeds a minimum value), then the memory cell has not been programmed (the memory cell is therefore at a first logic state, e.g., a one "1"). If, however, the memory cell does not conduct (e.g., the current through the cell does not exceed a threshold value), then the memory cell has been programmed (the memory cell is therefore at a second logic state, e.g., a zero "0"). Thus, each memory cell may be read in order to determine whether it has been programmed (and therefore identify the logic state of the data in the memory cell).

Flash memory is a type of electronic memory media which can be rewritten and hold its content without power. Flash memory devices generally have life spans from 100 K to 10 MEG write cycles. Unlike dynamic random access memory (DRAM) and static random access memory (SRAM) memory chips, in which a single byte can be erased, flash memory is typically erased and written in fixed multi-bit blocks or sectors. Conventional flash memories are constructed in a cell structure wherein a single bit of information is stored in each flash memory cell.

In such single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

More recently, flash memory devices have incorporated dual bit cell architectures, in which the core cells can each store two data bits. Dual bit memory cells are generally symmetrical, wherein the drain and source terminals are interchangeable. When appropriate voltages are applied to the gate, drain, and source terminals, one of the two bits may be accessed (e.g., for read, program, erase, verify, or other operations). When another set of terminal voltages are applied to the dual bit cell, the other of the two bits may be accessed.

Core cells in flash memory devices, whether single bit or multiple-bit, may be interconnected in a variety of different configurations. For instance, cells may be configured in a NOR configuration, with the control gates of the cells in a row individually connected to a word line. In addition, the drains of the cells in a particular row are connected together by a conductive bit line. In the NOR configuration, each drain within a single column is connected to the same bit line. In addition, each flash cell associated with a given bit line has its gate coupled to a different word line, while all the flash cells in the array have their source terminals coupled to a common source terminal, such as Vss or ground. In operation, individual flash cells in such a NOR configuration are addressed via the respective bit line and word line using peripheral decoder and control circuitry for programming (writing), reading, erasing, or other functions.

Another cell configuration is known as a virtual ground architecture, in which the gates of the core cells in a row are tied to a common wordline. A typical virtual ground architecture comprises rows of flash memory core cell pairs with a drain of one cell transistor coupled to an associated bit line and the source of the adjacent core cell transistor. An individual flash cell is selected via the word line and a pair of bit lines bounding the associated cell. For instance, such a cell may be read by applying voltages to the gate (e.g., via the common wordline) and to a bit line coupled to the drain, while the source is coupled to ground (Vss) via another bit line. A virtual ground is thus formed by selectively switching to ground the bit line associated with the source terminal of only those selected flash cells which are to be read. In this regard, where the core cells are of a dual bit type, the above connections can be used to read a first bit of the cell, whereas the other bit may be similarly read by grounding the bitline connected to the drain, and applying a voltage to the source terminal via the other bitline.

Where a virtual ground type core architecture is employed, problems may arise in reading the individual core cells (e.g., single bit or dual bit) comprising a group, such as a byte, word, etc. For instance, because all the cells associated along a word line have their drains and sources coupled in series, these cells have a combined leakage path through the drain or source side of the cell being sensed. The leakage current related to adjacent cells in the virtual ground type configuration may thus result in false readings of the data actually stored in a given cell, since the cell is read by sensing the current. Hence, there is a need for improved methods and apparatus by which the adverse effects of adjacent cell leakage current can be reduced or mitigated in virtual ground type flash memory devices.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later. The invention provides methods and apparatus by which the above shortcomings associated with reading virtual ground memory cells can be mitigated or overcome. The invention involves precharging one or more cells adjacent to a target cell of interest read, by which leakage current from such an adjacent cell can be reduced or mitigated during a read operation in a virtual ground memory device. Decoder circuitry and methodologies are provided for advantageous connection of the target cell and an adjacent cell to appropriate voltages or ground in order to facilitate the reading and precharging thereof, respectively. The invention thus provides for decoding of address lines associated with a virtual ground type memory device to provide appropriate connection to the core cells of interest through one or more switches in the decoder circuitry.

One aspect of the invention provides a memory device, wherein a memory core comprises a plurality of core memory cells organized in a virtual ground configuration. In such a configuration, adjacent memory cells (e.g., single or dual bit) have their gates tied to a common wordline, and the drain of one cell is tied to the source of an adjacent cell. The nodes connecting source and drain terminals are used as local bitlines to select the desired memory cell for read operations. For example, a memory device according to this aspect of the invention has a plurality of memory cells including a first cell with a drain connected to a first bitline, as well as a source connected to a second bitline. A second cell has a drain connected to the second bitline and a source connected to a third bitline. A third cell in the device has a drain connected to the third bitline and a source connected to a fourth bitline. The device further comprises a decoder which operates to precharge one of the first and third cells during a read operation associated with the second cell. The decoder, for example, may connect a read voltage to the drain of the second cell, and a precharge voltage to one of the adjacent cells while grounding the second cell source terminal. A current associated with the second cell can then be measured without adverse leakage current from the adjacent cells. The invention thus provides for improved cell reading in virtual ground type cell configurations, which can be used in association with single bit or dual bit type cell architectures.

The decoder comprises various switching devices, such as MOS type transistors, which are selectively activated according to the address lines of the memory device in order to read appropriate memory cells. The decoder can include a plurality of global bitlines, a plurality of intermediate bitlines, and a plurality of local bitlines individually connected to a source of one cell and a drain of an adjacent cell. Various switches are positioned between the global, intermediate, and local bitlines, which are used to connect various voltages or ground to the terminals of the target memory cell and an adjacent cell. Byte select switches are employed to connect drain read voltages, ground, and precharge voltages to individual global bitlines, which are selectively connected to intermediate and local bitlines using column select switches and sector select switches, respectively, according to decoder switching signals.

According to another aspect of the invention, methodologies are provided for reading a memory cell of a virtual ground memory core in a memory device. The methods can include selecting a first memory cell in the memory core to be read, precharging one of second and third memory cells adjacent to the first memory cell, and sensing a current associated with a terminal of the first cell to ascertain data associated with the cell. The first memory cell can be selected by connecting one of the drain and source terminals to a read voltage and connecting the other to ground. For instance, a first global bitline is connected to the read voltage, which is then connected to the drain, and a second global bitline is connected to ground, which is then connected to the source. Precharging the adjacent cell can be accomplished by connecting a third global bitline to a precharge voltage and connecting the third global bitline to a local bitline associated with the appropriate adjacent cell.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 3 is a schematic diagram illustrating a virtual ground array of memory cells together with word line and bit line decode circuitry;

FIG. 4 is a schematic diagram illustrating a configuration of a number of memory sectors into a larger memory array;

FIG. 10 is a truth table illustrating exemplary decoder logic for generating byte select drain and byte select ground switching signals in accordance with the invention;

FIG. 11 is a truth table illustrating exemplary decoder logic for generating byte select precharge switching signals in accordance with the invention;

FIG. 12 is a truth table illustrating exemplary decoder logic for generating column select switching signals in accordance with the invention;

FIG. 13 is a truth table illustrating exemplary decoder logic for generating sector select switching signals in accordance with the invention.

DETAILED DESCRIPTION OF THE INVENTION

Figure 1:
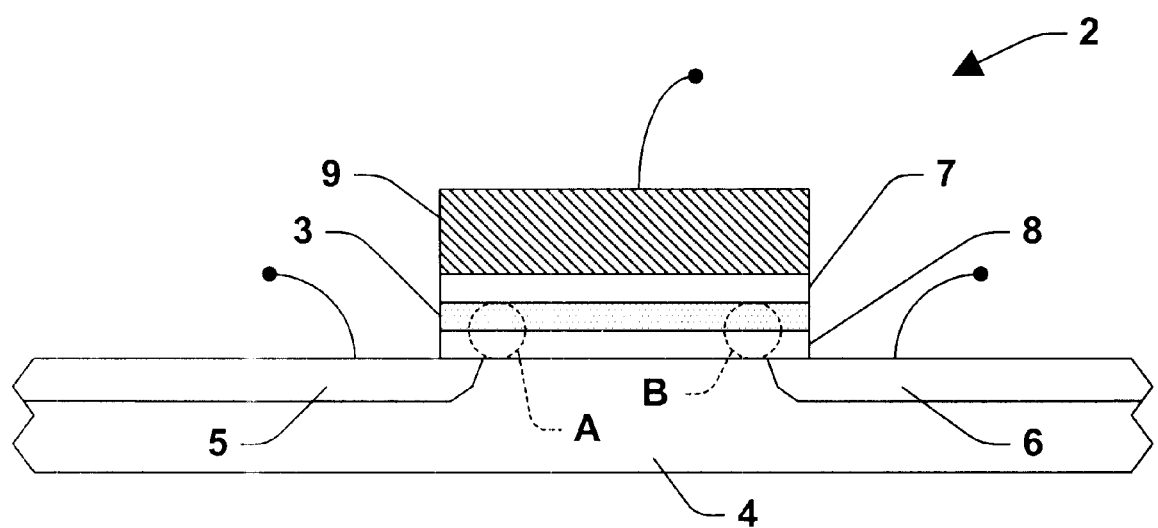
FIG. 1 is a side elevation view illustrating a dual bit memory cell.

One or more implementations of the present invention will now be described with reference to the drawings, wherein like reference numerals are used to refer to like elements throughout. The present invention relates to methods and apparatus for reading memory cells in a virtual ground architecture memory device, wherein adjacent cell leakage currents and the adverse effects associated therewith are mitigated or avoided by precharging such adjacent cells during a memory read operation. The invention provides decoder circuitry and methodologies by which appropriate connection of a target cell to a read voltage and ground, as well as of an adjacent cell to a precharge voltage are facilitated. The invention as illustrated and described hereinafter finds particular utility in association with virtual ground memory devices employing dual bit type memory cells. However, it will be understood that the various aspects of the invention are also applicable to other devices, such as those having single bit cells. Moreover, the invention may be employed for memory cell read operations using drain-side sensing as well as those employing source-side sensing.

Referring now to the drawings, FIG. 1 illustrates an exemplary dual bit memory cell 2 in association with which one or more of the various aspects of the invention may be carried out. The memory cell 2 comprises, for example, a silicon nitride layer 3 with buried polysilicon islands (not numerically designated) therein. A P-type substrate 4 has buried N+ source 5 and N+ drain 6 regions. The silicon nitride 3 is sandwiched between two layers of silicon dioxide 7 and 8. Alternatively, the layer 3 may comprise any other form of charge trapping layer. Overlying the oxide layer 7 is a polysilicon gate 9. This gate 9 is doped with an N-type impurity (e.g., phosphorus). The memory cell 2 is capable of storing two data bits, a left bit represented by the dashed circle A and a right bit represented by the dashed circle B. The dual bit memory cell 2 is generally symmetrical, thus the drain 6 and the source 5 are interchangeable. In this regard, the left junction 5 may serve as the source terminal and the right junction 6 as the drain terminal with respect to the right bit B. Likewise, the right junction 6 may serve as the source terminal and the left junction 5 as the drain terminal for the left bit A.

The memory read features and other aspects of the present invention may be implemented in association with various types of dual bit memory cell architectures, including the cell architecture of FIG. 1 as well as others not illustrated. In addition, the invention is applicable to such dual bit memory devices wherein both bits (e.g., bits A and B of cell 2) are used for data or information storage, as well as those in which only one bit (e.g., bit A of cell 2) of the dual bit cell is so used. Furthermore, it will be appreciated that the invention is applicable in association with single bit memory cells (not shown) organized in virtual ground type configurations in a memory device.

Figure 2:
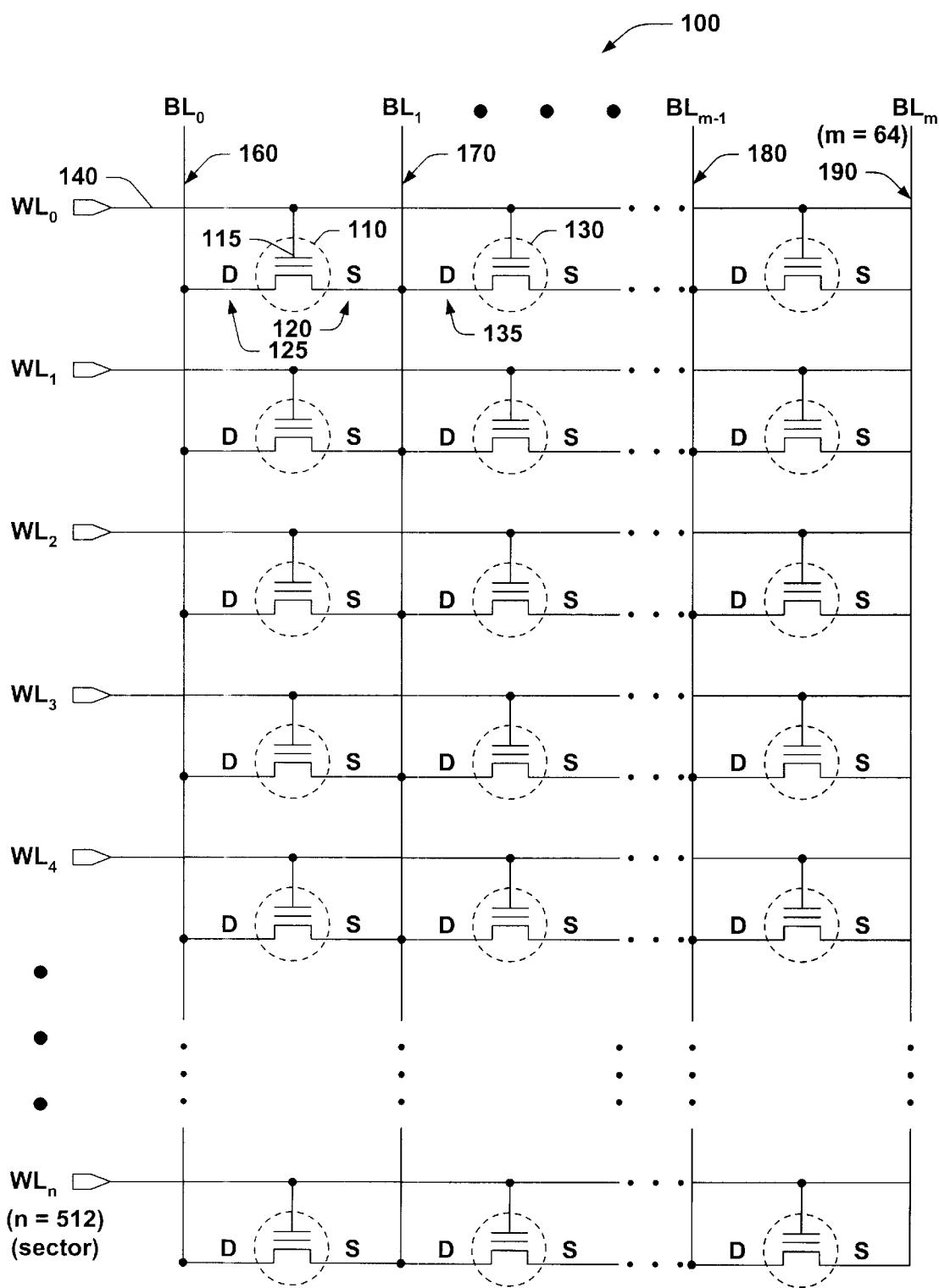
FIG. 2 is a schematic diagram illustrating a virtual ground flash EPROM memory array.

Referring now to FIG. 2, a "virtual ground" architecture 100 is illustrated comprising rows 140 of flash cells 110 with stacked gate terminals 115 coupled to an associated word line (e.g., $WL_0$ thru $WL_n$) 140, and columns (e.g., 160, 170, 180, 190) of flash cell pairs (e.g., 110 & 130) with a drain 135 of one transistor 130 coupled to an associated bit line (e.g., $BL_0$ thru $BL_m$) and the source 120 of the adjacent transistor 110 as well. It is noted that in FIG. 2, single bit stacked gate cells are illustrated solely for purposes of illustration and that virtual ground architectures are equally applicable to both single and multiple bit cell types. In addition, each single row of flash cells (e.g., 110 & 130) associated with a word line 140 is connected in series, with the source 120 of one cell 110 coupled to the drain 135 of an adjacent cell 130, wherein each drain terminal of the transistors within a single column is connected to the same bit line. Individual flash cells may be selected via the word line and a pair of bit lines bounding the associated cell. Thus, when a positive voltage is applied to the bit line ($BL_0$) 160 coupled to the drain 125 of the flash cell 110, a conductive path is established between the drain 125 and the source 120 thereof, which is coupled to the bit line ($BL_1$) 170 and to ground ($V_{SS}$). In this regard, it will be noted that a virtual ground is formed by selectively connecting a ground to the bit line associated with the source terminal of only those selected flash cells which are to be programmed or read.

Figure 5:
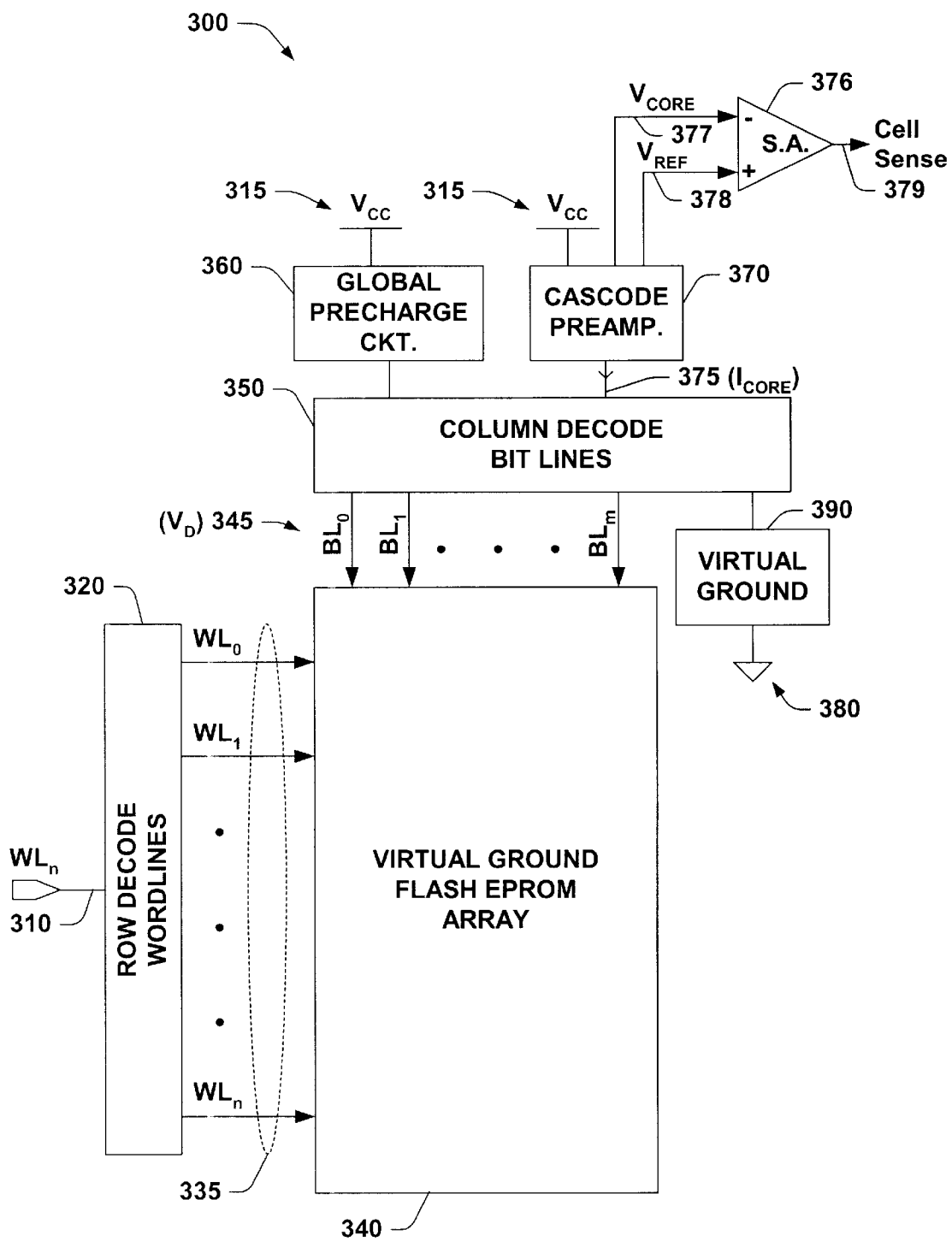
FIG. 5 is a schematic diagram illustrating a conventional scheme for indicating the state of a memory cell within a virtual ground array.

Referring now to FIGS. 3–5, FIG. 3 illustrates a single sector or IO 200 of virtual ground configuration flash memory cells 210, wherein the IO 200 comprises both row decode logic circuits 220 for selecting one or more word lines 225, and column decode logic circuits 230 for selecting two or more bit lines 235. The array IO 200 comprises, for example, 512 rows and 64 columns of memory cells 210, which are associated with 512 word lines 225 and 64 bit lines 235, respectively. As illustrated in FIG. 4, a full memory array 250 may comprise 16 such IOs 260 and 270 (e.g., similar to IO 200 of FIG. 3) with associated word line and bit line decode logic (not shown). A typical exemplary flash memory circuit 300 is shown in FIG. 5 comprising a row decode logic circuit 320 for selecting one or more word lines 335, and a column decode logic circuit 350 for selecting one or more bit lines 345 to address cells in a memory array 340. The flash array 340 comprises one or more sectors (e.g., 512 rows and 64 olumns) of memory cells, which are associated with an equivalent number of word lines and bit lines.

The circuitry to read the flash cells in the virtual ground circuit 300 includes a conventional global precharge circuit 360 to precharge all the bit lines of one or more sectors of the array with the same positive voltage $V_D$ (e.g., about 1.2 volts) 345, which is used to sense the flash cell current of a specified cell via a cascode current-to-voltage preamplifier circuit 370. The circuit 370 supplies the positive voltage $V_D$ generated from the $V_{CC}$ 315 to a bit line on the drain side of the selected flash cell within the array 340, while the source side of the selected cell is coupled thru another bit line to the ground 380 via the virtual ground switch circuitry 390 to generate a core cell sense current $I_{CORE}$ 375. The cascode preamplifier circuit 370, converts the core cell sense current $I_{CORE}$ 375 to a core cell sense voltage $V_{CORE}$ 377 for use in a sense amplifier 376. The cascode preamplifier 370 also generates a reference current $I_{REF}$ and converts this to a reference voltage $V_{REF}$ 378, which is compared to $V_{CORE}$ 377 in the sense amplifier 376. During a read operation, the sense voltage $V_{CORE}$ 377 associated with the flash cell sense current $I_{CORE}$ 375 is compared to the reference voltage $V_{REF}$ 377 in the sense amplifier 376 to produce a core cell verification signal 379 indicative of the logical state (e.g., "1" or "0") stored at the desired location.

Figure 6:
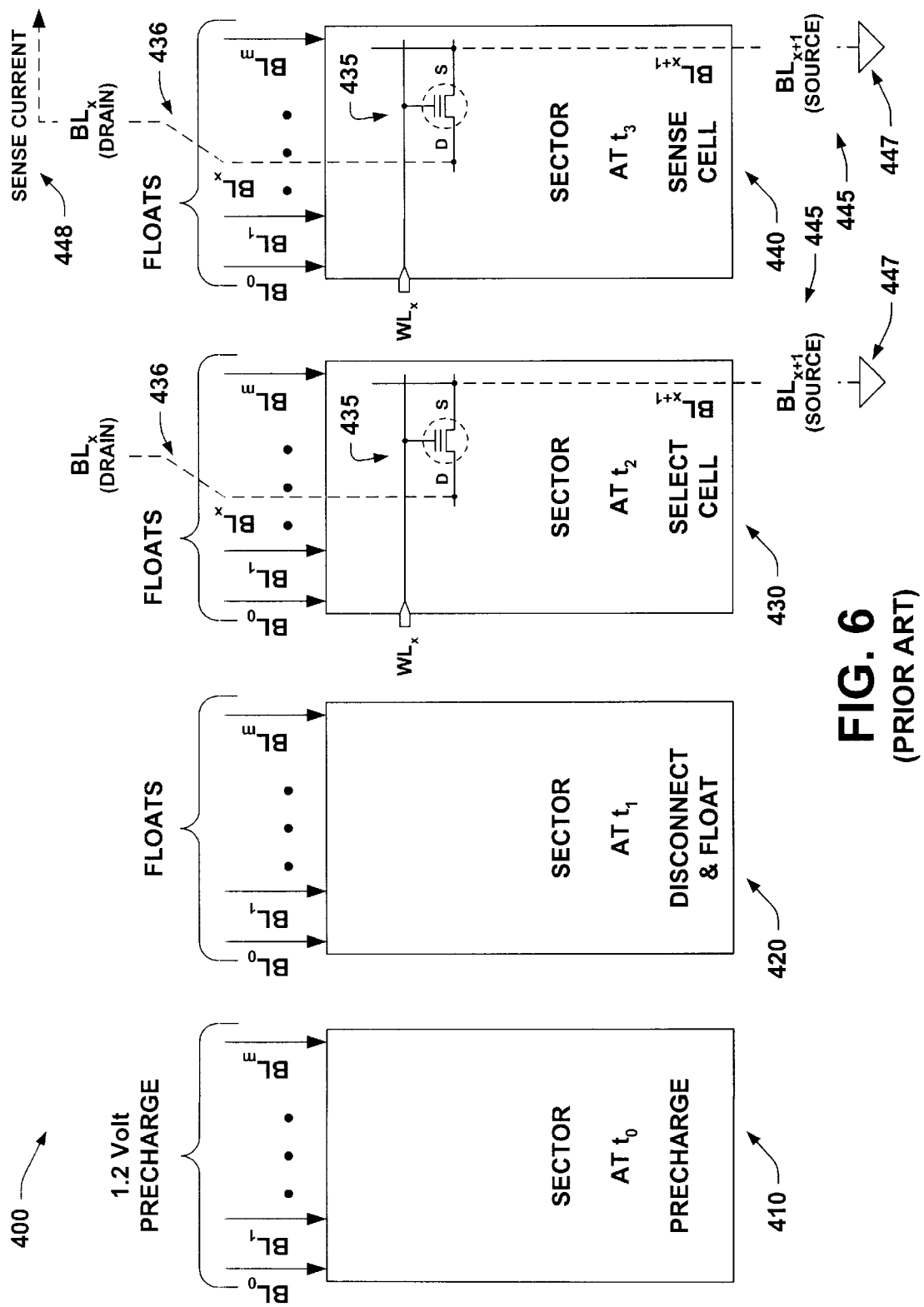
FIG. 6 is a schematic diagram illustrating four exemplary steps of a memory cell read operation in a virtual ground array.

FIG. 6 shows a conventional method 400 and four basic steps (410, 420, 430, 440) for reading a selected flash cell in the virtual ground circuit of FIG. 5. Initially, in a step 410 beginning at time $t_0$, all bit lines ($BL_0$ thru $BL_M$) are first precharged to the same positive voltage $V_D$ (e.g., about 1.2 volts) as is used to sense the flash cell current. By a time $t_1$ 420, the bit lines are assumed to be precharged to a positive voltage $V_D$. The global precharge circuit voltage $V_D$, is then disconnected from all the bit lines at time $t_1$ 420, and the bit lines are allowed to float without an applied voltage. At time $t_2$ 430, a core cell 435 is selected with a bit line $BL_X$ 436 at the drain side of the cell, an adjacent bit line $BL_{X+1}$ 445 at the source side of the cell, and a word line $WL_X$ coupled to the gate of the cell 435 to be sensed, while all other bit lines continue to float. In addition, the bit line $BL_{X+1}$ 445 is selectively coupled as a virtual ground to ground 447. At time $t_3$ 440, the flash cell 435 sensing operation 448 begins with the application of a word line voltage at $WL_X$, a bit line voltage $V_D$ (e.g., drain read voltage) at 436 to the drain, and a ground 447 to the source 445 of the selected flash cell 435.

Individual flash cell may thus be selected via a word line and a pair of bit lines bounding the associated cell. For example, in reading a flash cell of the sector of FIG. 6, a conduction path is established when a positive voltage $V_D$ is applied to one of the bit lines (e.g., $BL_X$) 436 coupled to the drain of a flash cell, the source of the flash cell is coupled to an adjacent bit line (e.g., $BL_{X+1}$) 445, which is selectively coupled to ground ($V_{SS}$) 447, and an appropriate word line (e.g., $WL_X$) voltage is applied to the gate of the selected cell. With a current thus established in the selected core cell, the core cell sense current 448 is converted to a cell sense voltage $V_{CORE}$ within the cascode current-to-voltage preamplifier circuit along with a reference cell voltage $V_{REF}$ which is passed to a sense amplifier (e.g., amplifier 376 of FIG. 5) to produce a core cell verification signal (e.g., signal 379 of FIG. 5), which is indicative of the data stored in the flash core cell.

As indicated above, however, the techniques illustrated in FIGS. 5 and 6 suffer from leakage currents associated with cells neighboring the cell being read. In this regard, the current $I_{CORE}$ which is sensed by the cascode preamplifier circuit 370 of FIG. 5 includes the current flowing through the target cell being read, as well as leakage current flowing into the adjacent cell (e.g., the cell connected to the same bitline as the drain of the target cell). Thus, the circuit and method of FIGS. 5 and 6 are prone to erroneous indications of the actual data stored in the target cell due to the leakage current effect. For instance, where the actual current flowing through the target cell is insufficient to generate a voltage $V_{CORE}$ greater than the reference voltage $V_{REF}$, the addition of such leakage current to the sensed current $I_{CORE}$ may result in a $V_{CORE}$ reading above $V_{REF}$.

It will be appreciated that the circuitry of FIG. 5 employs drain-side current sensing, wherein the cascode preamplifier circuit 350 senses the cell current between the drain of the target cell in the array 340 and the read voltage. Source-side sensing (not shown) can also be employed, wherein the target cell current is sensed between the target cell source and ground (e.g., between the column decode bitlines 350 and virtual ground 390 in FIG. 5). However, it will also be appreciated that adjacent or neighboring cell leakage currents can adversely affect the read operation in source-side sensing architectures. For instance, current from the target cell source in a source-side sensing configuration will flow through the current sensor to the virtual ground, but may also flow into the drain of the adjacent cell (e.g., into the drain of the adjacent cell connected to the source of the target cell). Thus, the measured current may be less than the actual target cell current, causing the potential for a false data read operation.

In addition to the cells immediately adjacent to a target cell, it is noted that other cells in the same row as the target cell may adversely affect data read operation for virtual ground cell organizations. In this regard, all the cells associated along a word line have their drains and sources coupled in series, and thus have a combined leakage path through the drain side of the cell being sensed. If a cell was selected, for example, at the end of the word line, there could be as many as 64 cells of combined leakage current seen at the drain side of the cell whose current is being sensed. Another shortcoming of the sensing scheme of FIGS. 5 and 6 is the power which is wasted precharging all the bit lines of one or more sectors of the array.

The present invention addresses the above and other problems in virtual ground type memory structures, facilitating stable, low power means of eliminating the effects of charge sharing leakage currents to adjacent and/or neighboring cells and loss in transient sense current during memory cell current read operations, resulting in substantially improved signal margins in a virtual ground flash memory array system. The invention provides decoder circuitry and techniques by which adjacent cells are precharged to avoid or mitigate leakage currents associated therewith during a read operation. The adjacent cell precharging may be performed prior to or simultaneously with the provision of a read voltage and virtual ground to the target cell, and the read operation may include multiple phases. Furthermore, the invention provides for precharging of the appropriate adjacent core memory cell to mitigate leakage current effects in drain-side sensing configurations, as well as for source-side sensing. Moreover, the invention is applicable in memory devices employing single bit cells and/or devices having multiple-bit (e.g., dual bit) memory cells.

Figure 7:
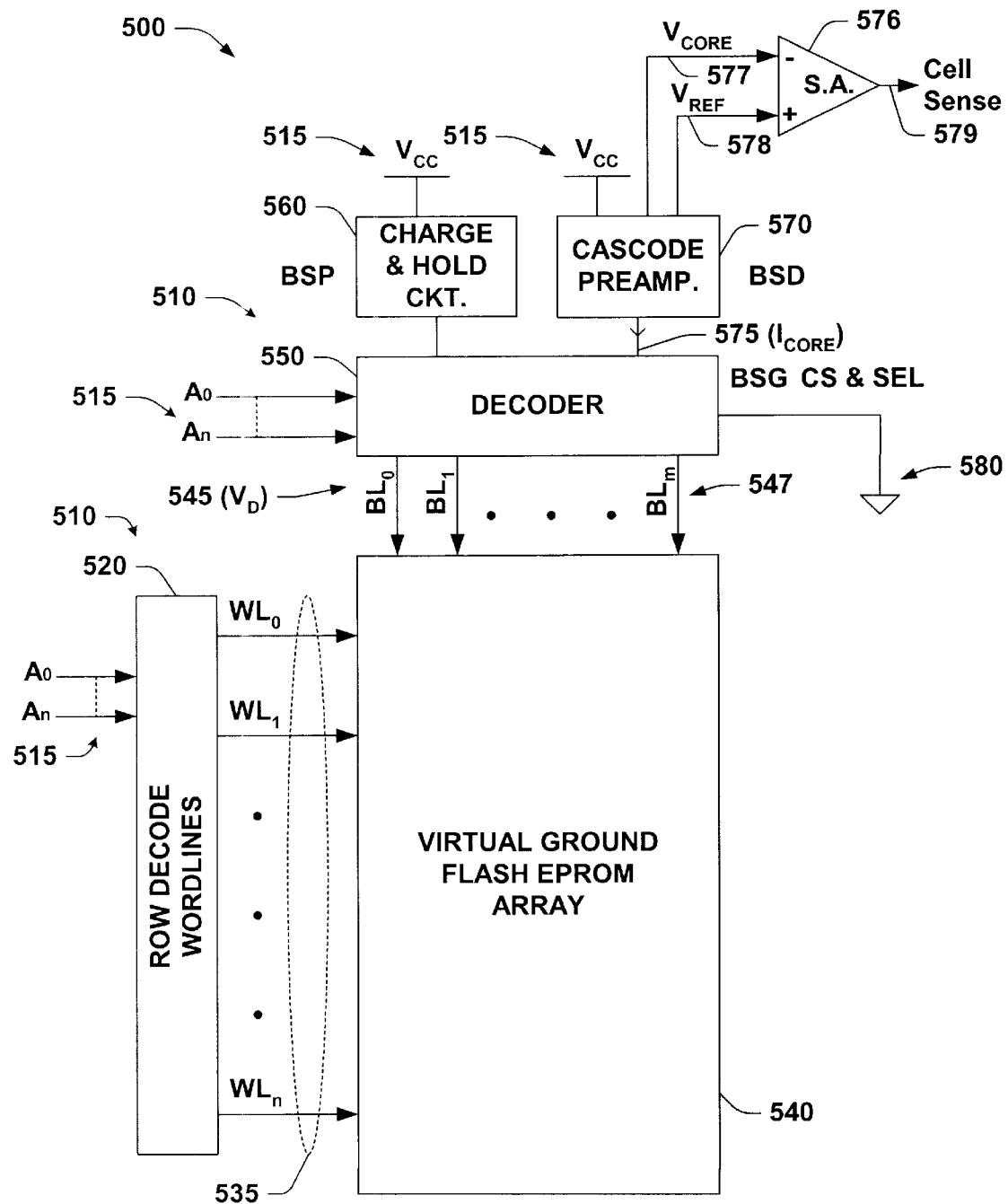
FIG. 7 is a schematic diagram illustrating an exemplary system for a drain-side sensing scheme with adjacent bit charge, in which various aspects of the invention may be carried out.

Referring now to FIG. 7, the invention relates to virtual ground flash memory decoder circuitry and methodologies for reading a flash memory cell in a virtual ground flash memory read operation. The system comprises a charge and hold circuit which is operable to apply a precharge voltage (e.g., about 1.2 volts) to a bit line of the cell of the flash array adjacent to the target cell, wherein the precharge voltage is substantially the same as the drain read voltage (e.g., about 1.2 volts) applied to the bit line of the sensed cell. The system also provides decoding apparatus to select the bit lines of a target memory cell to be read and the bit line of an adjacent cell during memory read operations, wherein applying substantially the same voltage to the bit line of the cell adjacent to the cell being sensed, reduces or mitigates the adverse effects of adjacent cell leakage current.

An exemplary system 500 is illustrated, which employs drain-side sensing for reading a memory cell (e.g., or a column thereof), together with adjacent bit precharging, in which various aspects of the invention may be implemented. The circuit 500 comprises decoder circuitry 510 having row decode logic 520 for selecting one or more word lines 535, and decoder circuitry 550 for selecting one or more bit lines 545 which are coupled to memory cell drain and source terminals within a virtual ground flash memory array 540. The decoder circuitry 510 decodes address lines 515 to generate the appropriate wordlines 535 via circuit 520, and bitlines 547 via circuit 550, whereby the appropriate cells in the memory array 540 can be accessed, such as in a read operation.

In the array 540, rows of memory cells have their gate terminals connected to a common wordline 535, and the individual cells within such rows are selected by bitlines connected to the drain and source terminals thereof. The cells within a row are interconnected, wherein the source of one cell is connected to the drain of the adjacent cell, as well as to a bitline 547. Individual bitlines 547 are thus used to provide appropriate voltages to the drain and source of a target cell, while the wordlines 535 are used to provide appropriate gate voltages, in order to perform various operations (e.g., read, program, erase, verify, etc.) with respect to the array 540. The array 540 also comprises one or more sectors (e.g., 512 rows and 64 columns) of memory cells, which are associated with an equivalent number of word lines and bit lines.

In accordance with the present invention, the decoder 510 selectively connects the precharge voltage from the circuit 560 to a cell adjacent to the cell of interest during a read operation. The decoder 510 also connects the drain and source of the target cell to a read voltage from circuit 570 and ground 580, respectively, in order to generate and sense the cell current 575 associated therewith. In this manner, the data bit or bits in a cell can be read. It will be appreciated that while the system 500 employs drain-side sensing, the decoder circuitry of the invention can be employed in association with source-side sensing schemes as well. The circuit 500 further includes a charge and hold circuit 560 providing a precharge voltage (e.g., a positive voltage $V_D$ 545 of about 1.2 volts) to the decoder 550 for selective application to a cell adjacent to the target cell in one or more sectors of the array 540 during a read operation, wherein the precharge voltage 545 is generated from $V_{CC}$ 515.

A cascode current-to-voltage preamplifier circuit 570 senses the target cell current by supplying virtually the same positive voltage $V_D$ (e.g., about 1.2 volts) 545 generated from the $V_{CC}$ 515, via the decoder circuit 550 to a bit line on the drain side of the selected flash cell within the array 540. The source side of the selected cell is coupled thru another bit line via the decoder 550 to the ground 580 to generate a core cell sense current $I_{CORE}$ 575. The circuit 570 converts the current $I_{CORE}$ 575 to a core cell sense voltage $V_{CORE}$ 577 for use in a sense amplifier 576. The preamplifier 570 also generates a reference current $I_{REF}$ (not shown) and converts this to a reference voltage $V_{REF}$ 578, which is compared to $V_{CORE}$ 577 by the amplifier 576. During a read operation, the sense voltage $V_{CORE}$ 577 is compared to the reference voltage $V_{REF}$ 577 in the sense amplifier 576 to produce a core cell signal 579 indicative of the data in the target cell being read.

Figure 8A:
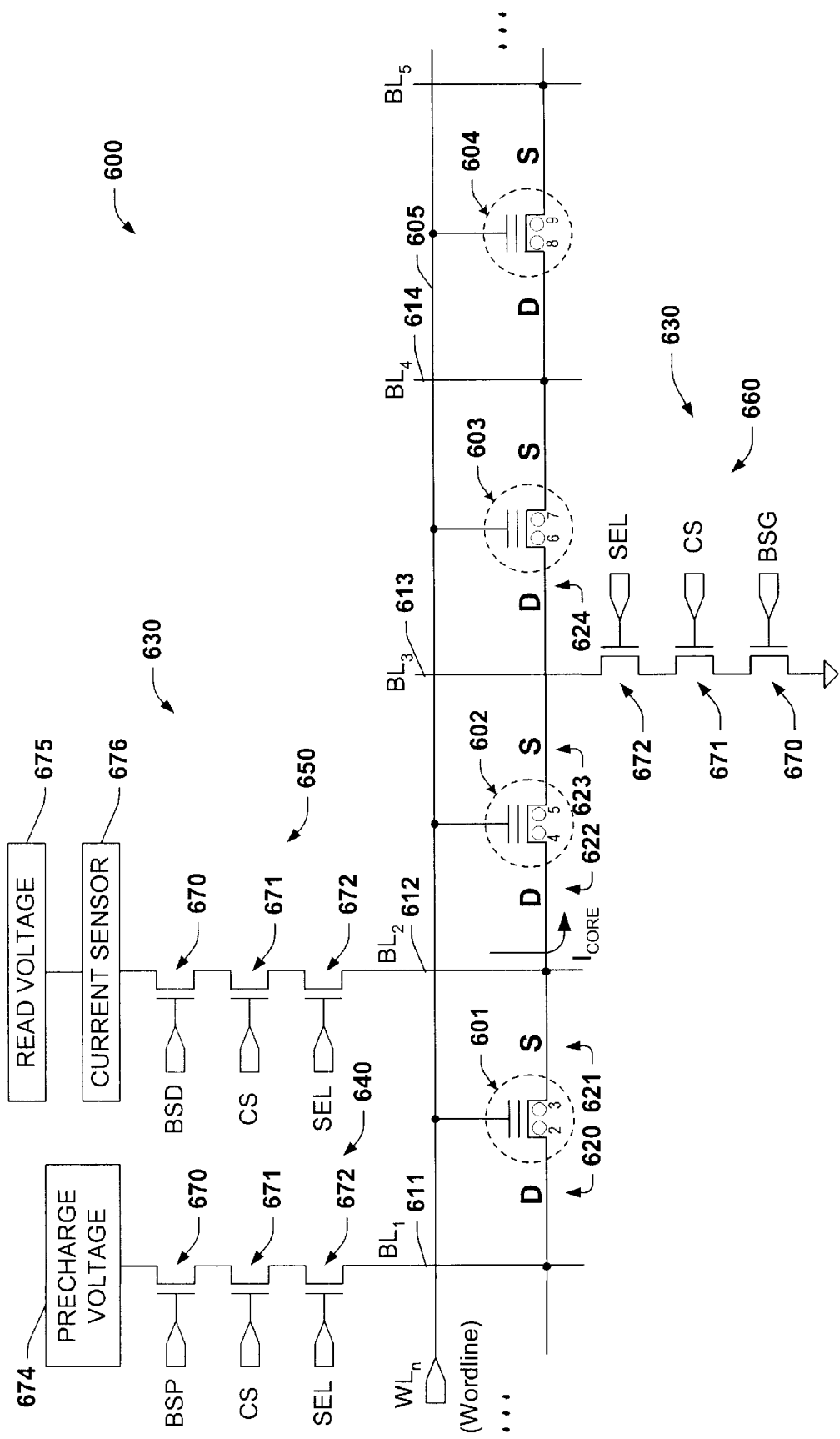
FIG. 8a is a schematic diagram illustrating an exemplary virtual ground array segment with a target dual bit cell and an adjacent cell, and decoder circuitry for reading a first data bit of the target cell using drain-side sensing in accordance with the present invention.

Referring now to FIGS. 8a–8d, the operation of the present invention is illustrated in various configurations. In FIG. 8a, drain-side sensing is employed in association with dual bit memory cells in a flash memory device 600. The device 600 comprises first, second, third, and fourth MOS type dual bit cells 601, 602, 603, and 604, respectively, having gate, drain, and source terminals. The gate terminals of the cells 601, 602, 603, and 604 are tied to a common wordline 605, and the device 600 further comprises first, second, third, and fourth bitlines 611, 612, 613, and 614, respectively, wherein the drain terminal 620 of cell 601 is connected to bitline 611. The source terminal 621 of cell 601 and the drain 622 of cell 602 are connected to the second bitline 612. Similarly, the third bitline 613 is connected to the source 623 of cell 602 and the drain 624 of the third cell 603. The device 600 comprises other cells (not shown) in the row having gates connected to the wordline 605 and associated bitlines therebetween connected to the drain of one cell and the source of an adjacent cell in a virtual ground configuration.

In accordance with the present invention, a decoder circuit 630 comprises first, second, and third switches 640, 650, and 660, respectively, each comprising a byte select switch 670, a column select switch 671, and a sector select switch 672, arranged in series. During a read operation, where a first bit (e.g., bit 5) in dual bit cell 602 is to be read, the three switches 670, 671, and 672 of the first switch 640 conduct in order to connect the first bitline 611 with a precharge voltage 674. Likewise, the three switches 670, 671, and 672 of the second switch 650 are turned on so as to connect the second bitline 612 to a read voltage 675 through a current sensor 676, and the three switches 670, 671, and 672 of the third switch 660 conduct in order to connect the third bitline 613 to ground. The decoder 630 thus operates to precharge the first cell 601 during a read operation associated with the second cell 602, wherein current $I_{CORE}$ through the target cell 602 flows from the read voltage 675 through the current sensor 676 and the cell 602 to ground by virtue of the second and third switches 650 and 660, respectively. It will be noted at this point that the decoder 630 can comprise arrays or groups of multiple such byte select, column select, and sector select switches 670, 671, and 672, which are selectively activated by decoder signals (not shown) to form the first, second, and third switches 640, 650, and 660.

It will be appreciated that absent the application of the precharge voltage 674 to the drain 620 of the adjacent cell 601, leakage current could flow from the read voltage 675 and into the cell 601, resulting in the possibility of an erroneous sensing by the current sensor 676, since such leakage current and the cell current $I_{CORE}$ are additive in the illustrated drain-side sensing configuration. The additive relationship between the desired cell current from cell 602 and the leakage current associated with adjacent cell 601 results from the employment of drain-side sensing in the device 600, where the current sensor 676 is connected between the bitline 612 and the read voltage 675 via the second switch 640. However, the invention mitigates or overcomes this shortcoming by providing the precharge voltage to the adjacent cell 601 via the decoder 630 so as to reduce or eliminate such leakage current during the read operation.

Figure 8B:
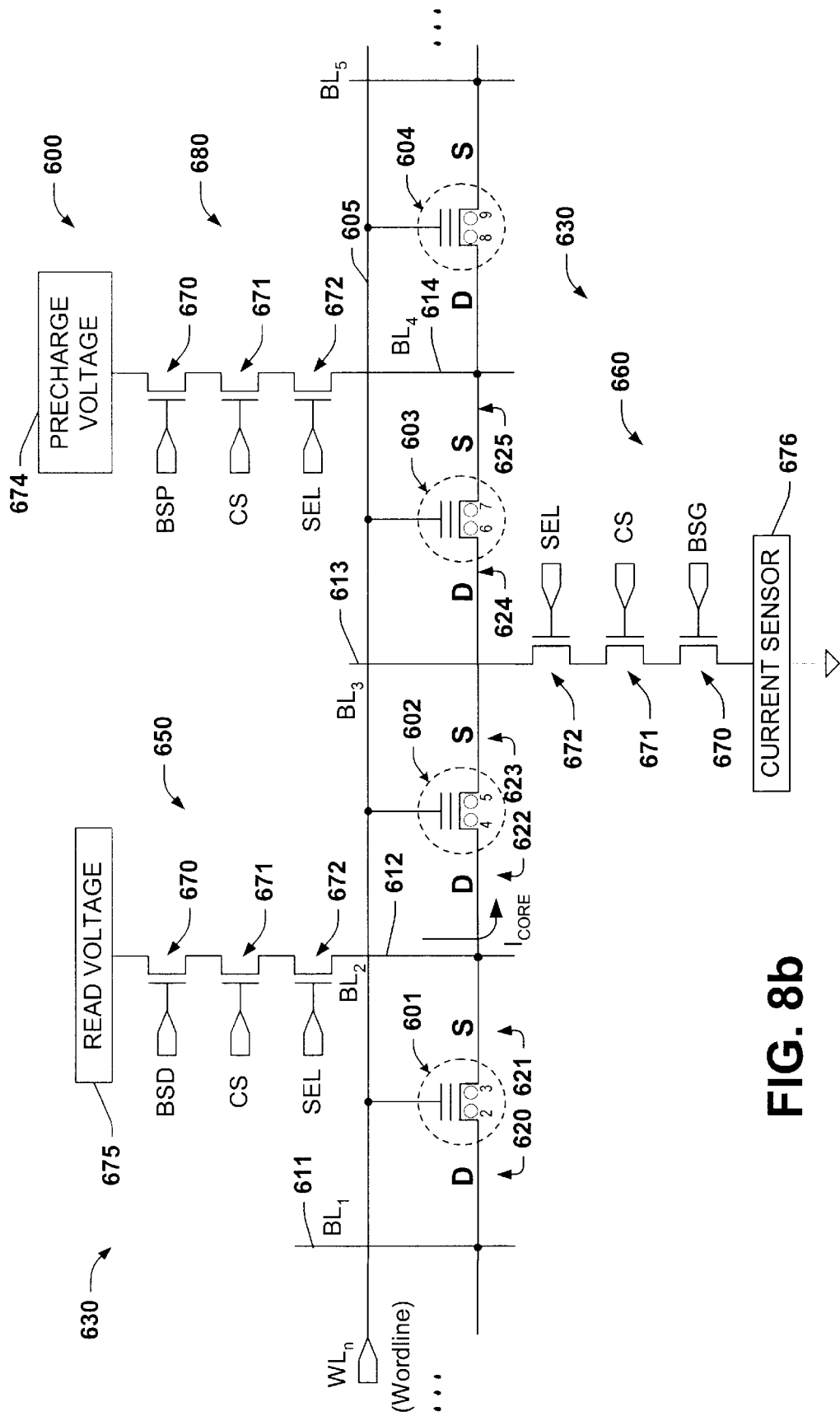
FIG. 8b is a schematic diagram illustrating the virtual ground array segment of FIG. 8a with decoder circuitry for reading the first data bit of the target cell using source-side sensing in accordance with the present invention.

Referring now to FIG. 8b, the invention can be employed to mitigate adjacent cell leakage current effects where source-side current sensing is used. In FIG. 8b, the current sensor 767 is connected between the third bitline 613 and ground via the third switch 660 to sense the current $I_{CORE}$ through the second cell 602 during a read operation associated with the bit 5 of the cell 602. The second switch 650 is employed to connect the second bitline 612 to the read voltage 675. In the source-side sensing organization of FIG. 8b, leakage current from the first cell 601 will not affect the current $I_{CORE}$ since the current associated with the cell 602 is being sensed on the source side. Rather, any leakage current from the other adjacent cell 603 can affect the reading of cell 602. The invention to provides for connecting the precharge voltage 674 to the fourth bitline 614 via a fourth decoder switch 680 comprising a byte select switch 670, a column select switch 671, and a sector select switch 672. In this regard, where such source-side sensing is employed as in FIG. 8b (e.g., and in FIG. 8d below), the precharge voltage 674 is advantageously ground, so as to effectively short the adjacent cell 603, thus preventing current from the target cell 602 from conducting through the adjacent cell 603, as well as preventing current from the adjacent cell 603 from flowing through the third switch 660 and into the current sensor 676. Precharging the adjacent cell 603 thus reduces or mitigates the leakage current from the third cell 603 so as to provide improved read operation in the device 600 with respect to bit 5 of the target cell 602.

Figure 8C:
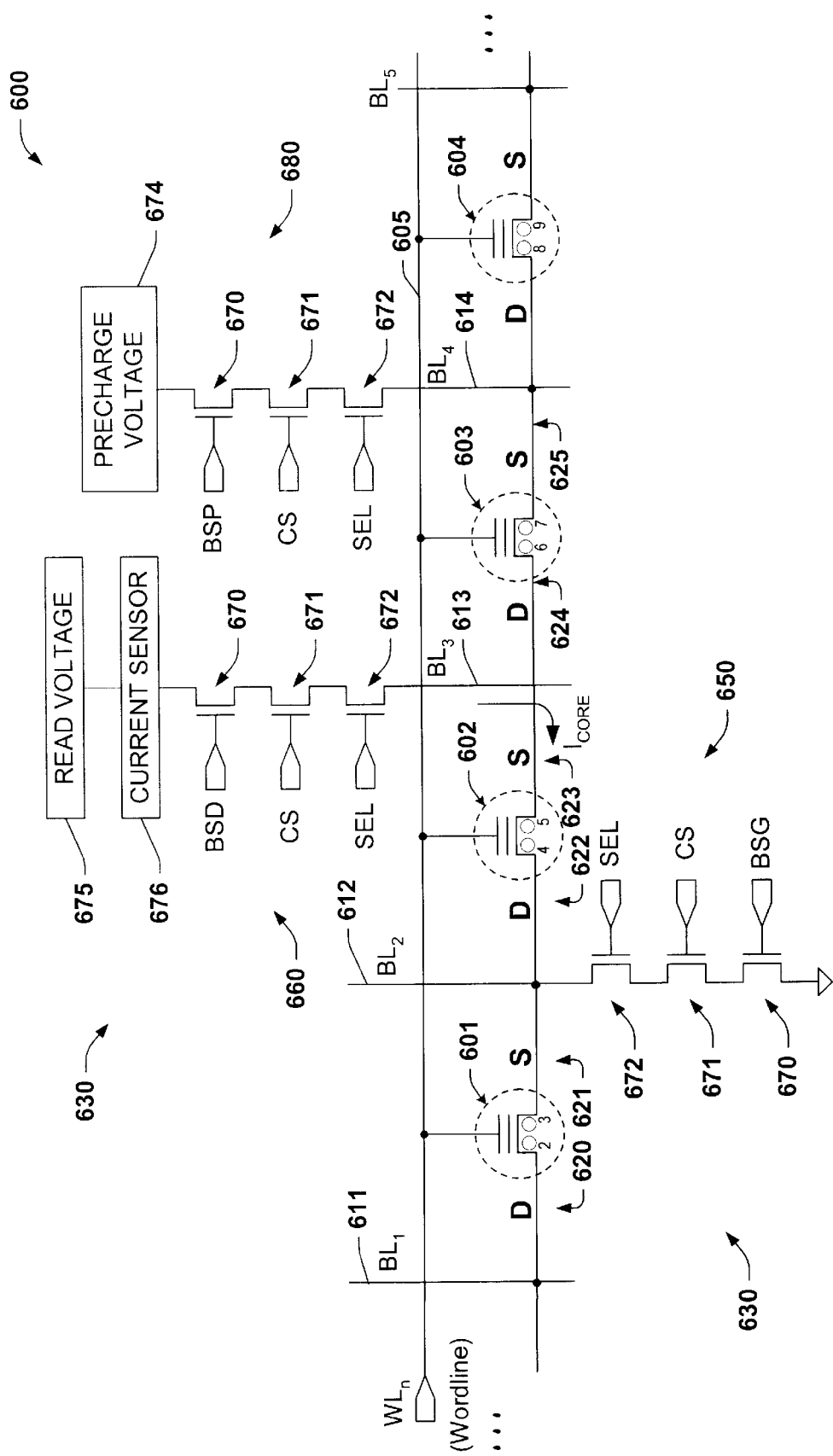
FIG. 8c is a schematic diagram illustrating the virtual ground array segment of FIGS. 8a–8b with decoder circuitry for reading a second data bit of the target cell using drain-side sensing in accordance with the present invention.

Another variant is illustrated in FIG. 8c, wherein a read operation is performed to ascertain the data in another bit (e.g., bit 4) of the second cell 602 using drain-side sensing. The second switch 650 of the decoder circuit 630 connects the second bitline 612 (e.g., and hence the drain terminal 622 of the second cell 602) to ground, and the third switch 660 connects the third bitline 613 (e.g., and hence the source terminal 623 of the cell 602) to the read voltage 675 through the current sensor 676. As opposed to the configuration of FIG. 8a wherein bit 5 of cell 602 was read, in FIG. 8c, the other bit (e.g., bit 4) of the dual bit cell 602 is read. In this case, the drain terminal 622 is grounded while the source terminal 623 is brought to the read voltage through the current sensor 676.

For consistency, the term drain-side sensing is used herein to refer to sensing current on the read voltage side of the cell, and source-side sensing refers to sensing cell current on the ground side of the cell, although the drain and source terminals may be alternatively used depending upon which bit of a dual bit cell is being accessed. It will be noted that unlike the situation in FIG. 8a, leakage current associated with cell 601 in FIG. 8c does not affect the current $I_{CORE}$. Rather, leakage current into the drain terminal 624 of the adjacent cell 603 could result in erroneous reading of the data in bit 4 of the target cell 602. In this situation, the invention provides for connection of the precharge voltage 674 to the fourth bitline 614 using the fourth switch 680, thereby effectively shorting the adjacent cell 603. This reduces or mitigates the leakage current associated with the cell 603, whereby improved read operation can be achieved.

Figure 8D:
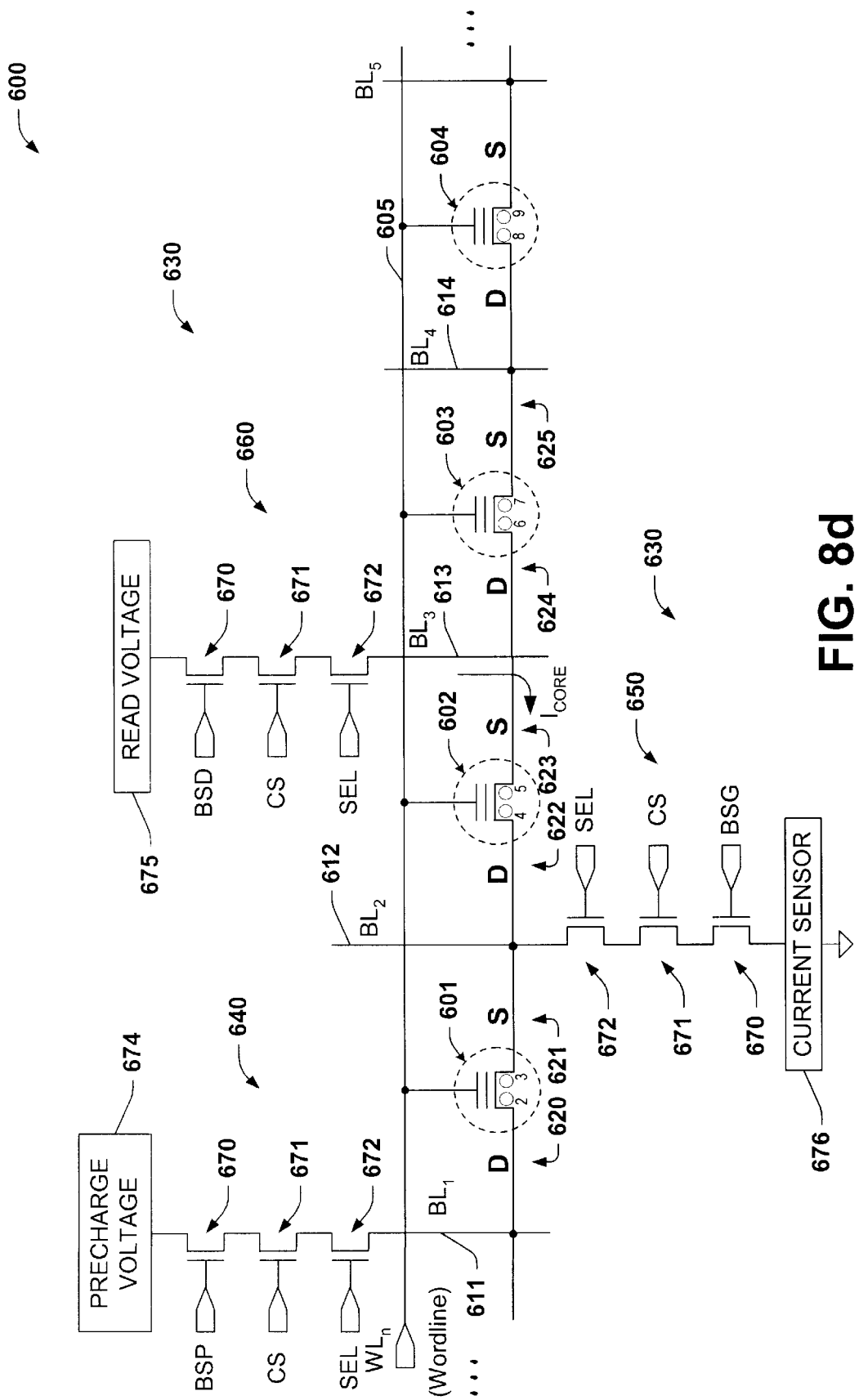
FIG. 8d is a schematic diagram illustrating the virtual ground array segment of FIGS. 8a–8c with decoder circuitry for reading the second data bit of the target cell using source-side sensing in accordance with the present invention.

Yet another variation is illustrated in FIG. 8d, wherein source-side sensing is used to read the second bit (e.g., bit 4) of the dual bit second memory cell 602. In this situation, the first switch 640 of the decoder 630 connects the first bitline 611 to the precharge voltage 674 (e.g., ground, to short the adjacent cell 601) in order to mitigate leakage current associated with the first cell 601. The second switch 650 connects the second bitline 612 to ground through the current sensor 676, and the third switch 660 connects the third bitline 613 to the read voltage 675. Comparing FIGS. 8b and 8d, it is noted that in using source-side sensing, the application of read voltage 675 and ground to the source 623 and drain 622 of the target cell 602 is reversed depending upon which data bit of the dual bit cell 602 is being read. Comparing FIGS. 8a and 8c, the same is true of drain-side sensing. Furthermore, it is noted that depending upon which bit is read, the adjacent cell to which the precharge voltage 674 is applied is switched. Thus, the decoder 630 can be used to mitigate or overcome problems associated with adjacent cell leakage current in any situation involving single bit or multiple-bit cells using source or drain-side sensing in a virtual ground memory structure.

Figure 9A:
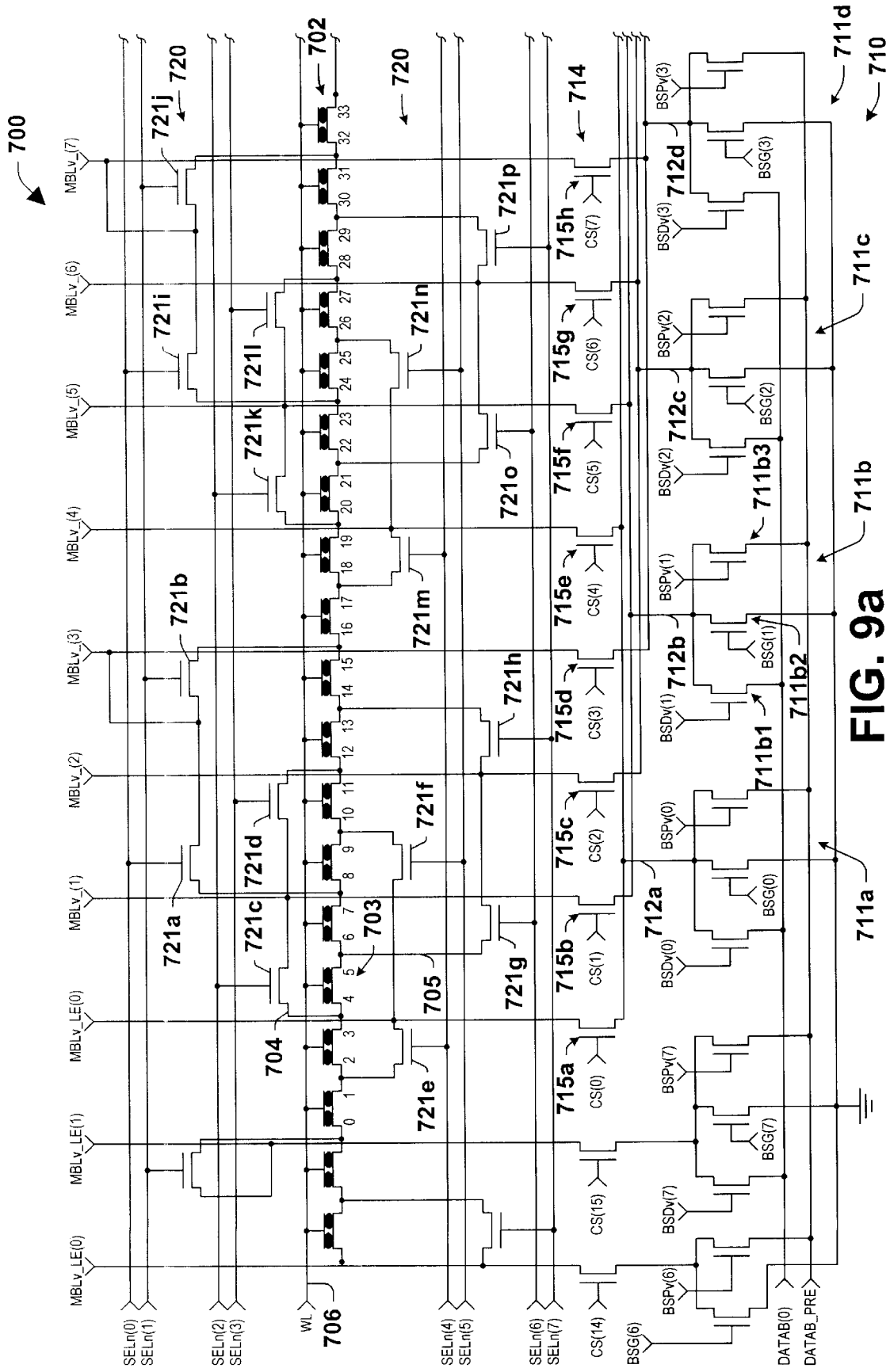
FIG. 9a is a schematic diagram illustrating a portion of an exemplary virtual ground memory core having dual bit memory cells and decoder circuitry in accordance with various aspects of the present invention.

As illustrated and described above, the decoding circuitry and techniques of the present invention can be applied in a variety of virtual ground memory devices. Referring now to FIG. 9a, another exemplary implementation of the present invention further illustrates various features of the invention. In FIG. 9a, a portion of a memory device 700 is illustrated comprising a row of memory cells 702, wherein the device 700 comprises many such rows and only a single row is illustrated for the sake of clarity. The individual memory cells 702 are a dual bit type, wherein each such cell can store two data bits of information. For purposes of illustration, bit numbers for several such data bits are located near some of the illustrated cells 702 for reference in the following description. For example, one such cell 703 is able to store bits 4 and 5, with a drain terminal connected to a local bitline 704 and a source terminal connected to another local bitline 705. The gates of all the cells 703 in the row are connected to a common wordline 706.

In accordance with the present invention, decoder circuitry in the device 700 comprises a byte select switch array 710 having four byte select switch groups 711a–711d individually associated with corresponding global bitlines 712a–712d. The byte select switch groups 711a–711d individually comprise a byte select drain switch transistor switched according to a byte select drain signal BSDv(x), which is connected between a drain read voltage terminal DATAB(0) and an associated global bitline, a byte select ground switch transistor controlled by a byte select ground signal BSG(x), connected between ground and the associated global bitline, and a byte select precharge switch connected between a precharge voltage terminal DATAB$_{13}$ PRE and the associated global bitline, which is actuated by a byte select precharge signal BSPv(x). In the device 700, drain-side sensing is employed, wherein a current sensor (not shown) is situated between the read voltage terminal DATAB(0) and a read voltage source (not shown).

One byte select switch group 711b comprises a first transistor 711b1 connected between DATAB(0) and the global bitline 712b and controlled by a signal BSDv(1), a second transistor 711b2 connected between the global bitline 712b and ground and controlled by a signal BSG(1), and a third transistor 711b3 connected between the global bitline 712b and DATAB_PRE. The exemplary decoder of device 700 activates one of the three transistors 711b1, 711b2, and 711b3 during a read operation in order to selectively connect the global bitline 712b to one of ground, a precharge voltage (e.g., terminal DATAB_PRE), and a read voltage (e.g., DATAB(0)).

The device 700 further comprises intermediate bitlines MBLv(y), and the decoder circuitry provides a column select switch array 714 comprising a plurality of column select switch transistors 715a–715h switching according to signals CS(0)–CS(7), respectively. The column select transistor switches 715 are located between an associated global bitline and an intermediate bitline so as to selectively provide connection therebetween according to the column select decoder signals CS. For example, column select switch transistor 715b is connected between global bitline 712b and intermediate bitline MBLv(1) to selectively connect the bitlines 712b and MBLv(1) according to the decoder signal CS(1). Also, column select transistor 715f selectively connects the global bitline 712b with intermediate bitline MBLv(5) according to signal CS(5).

In addition, the memory device 700 comprises a sector select switch array 720 comprising sector select switches or transistors 721a–721p individually connected between an associated intermediate bitline MBLv(y) and an associated local bitline. For example, the sector select transistor 721c connects the intermediate bitline MBLv(1) with the local bitline 704 at the drain terminal of the memory cell 703 according to a sector select decoder signal SELn(2). The decoder provides the signals (e.g., BSDv(x), BSG(x), and BSPv(x)) to the byte select switches 711, signals CS to the column select switches 715, and signals SELn(i) to the sector select switches 721, according to address lines (not shown) in a read operation. The decoder signals thus provide appropriate interconnections via the switches 711, 715, and 721 in order to read a first memory cell (e.g., cell 703) and to precharge a second (e.g., adjacent) memory cell in the memory core during a read operation.

Figure 11:
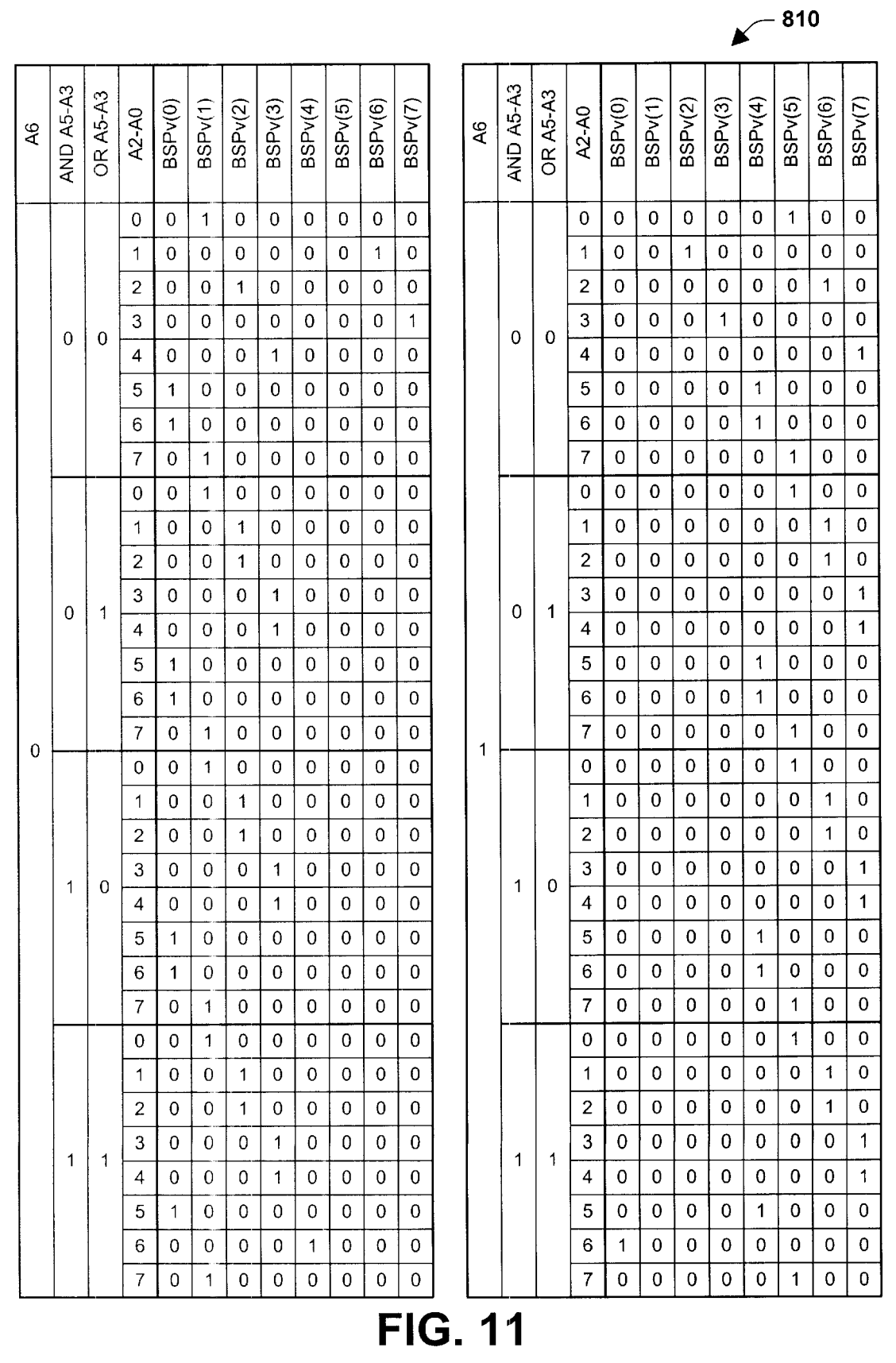

Referring now to FIGS. 10–13, the decoder of the memory device 700 comprises the above switching devices and logic circuitry providing the switching signals for operation of the appropriate switches 711, 715, and 721 to read a cell and precharge an adjacent cell. In FIG. 10, a truth table 800 illustrates the decoding of address lines A0–A6 to provide the byte select drain signals BSDv(x) and the byte select ground signals BSG(x) for the switches 711 of the device 700. In FIG. 11, a truth table 810 illustrates the logical decoding of the address lines A0–A6 to generate the byte select precharge decoder signals BSPv(x) for the switches 711. A truth table 820 in FIG. 12 illustrates the decoding of address lines A0–A5 to provide the column select decoder signals CS for the switches 715, and FIG. 13 illustrates a table 830 for decoding address lines A0–A2 to generate the sector select control signals SELn(i) for the switches 721.

Referring now to FIGS. 9a, 9b, and 10–13, FIG. 9b illustrates a read operation in the memory device 700, wherein a first data bit (e.g., bit 5) of cell 703 is read. The decoder signals are applied to the appropriate byte select, column select, and sector select transistor switches 711, 715, and 721, respectively, in order to connect local bitline 704 (e.g., and hence the drain of the target cell 703) to the read voltage through terminal DATAB(0). In addition, the decoder connects the source terminal (e.g., local bitline 705) to ground, and connects a local bitline 707 associated with a drain terminal of an adjacent cell 708 to a precharge voltage via the DATAB_PRE terminal, as indicated by the non-directional dashed lines in FIG. 9b. Drain-side sensing is employed to sense the resulting cell current through the target cell 703 along the conduction path indicated by the bold dashed directional lines in FIG. 9b. In this fashion, a determination is made as to the data stored in bit 5 of the cell 703 while reducing or mitigating leakage current effects associated with the adjacent memory cell 708.

Figure 9B:
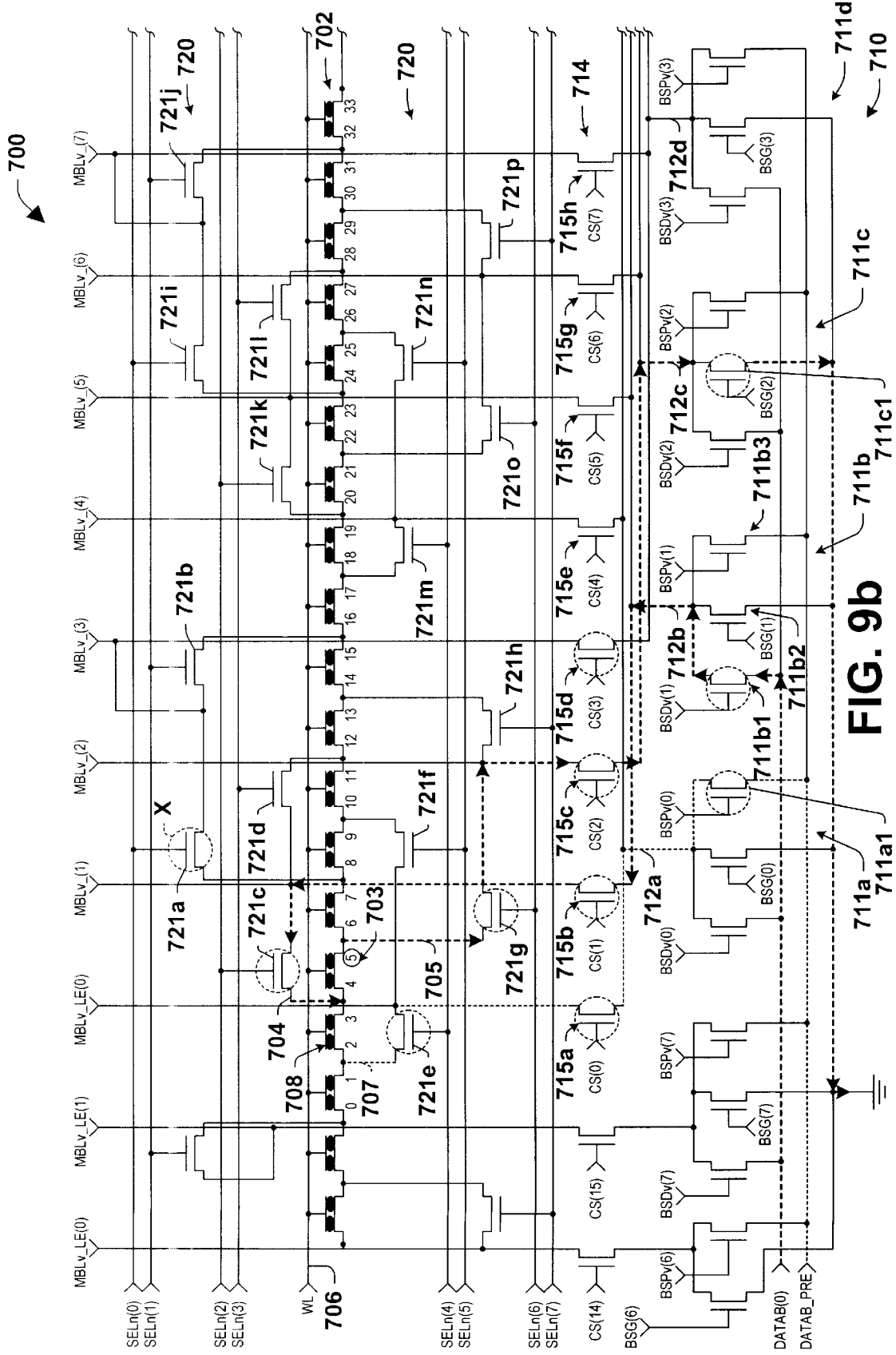
FIG. 9b is a schematic diagram illustrating the memory core of FIG. 9a, wherein a first bit of a target dual bit cell of interest is being read in accordance with the present invention.

As illustrated in FIG. 9b, as well as in the truth tables 800 and 810 of FIGS. 10 and 11, the decoder provides a byte select switching control signal BSDv(1) to a byte select transistor 711b1 to connect the global bitline 712b to the read voltage via terminal DATAB(0), a signal BSG(2) to a byte select transistor 711c1 to connect global bitline 712c to ground, and a signal BSPv(0) to transistor 711a1 to connect the global bitline 712a to the precharge voltage (e.g., DATAB_PRE). As illustrated in FIGS. 9b and 12, the decoder further provides column select control signals CS(0)–CS(2) to activate column select transistor switches 715a–715c, respectively. This connects global bitlines 712a, 712b, and 712c to intermediate bitlines MBLv_LE(0), MBLv(1), and MBLv(2), respectively. It is noted at this point, that the exemplary decoder further actuates column select transistor 715d via signal CS(3) in order to simplify the decoding, but that this transistor 715d need not be activated to perform the desired read of bit 5 of cell 703.

Referring to FIGS. 9b and 13, the decoder further activates sector select transistors 712c, 712e, and 712g via sector select decoder control signals SELn(2), SELn(4), and SELn(6) to connect the intermediate bitlines MBLv(1), MBLv_LE(0), and MBLv(2) to local bitlines 704, 707, and 705, respectively. The selective activation of the byte select, column select, and sector select transistors thus connects the local bitline 704 (e.g., and hence the drain of the target cell 703) to the read voltage, the source terminal (e.g., local bitline 705) to ground, and the a local bitline 707 associated with the drain terminal of the adjacent cell 708 to the precharge voltage.

Referring now to FIGS. 9c and 10–13, the decoder fuirther provides for adjacent cell precharging where the other bit (e.g., bit 4) of the dual bit target cell 703 is read. The decoder signals are applied to the appropriate byte select, column select, and sector select transistor switches 711, 715, and 721, respectively, in order to connect local bitline 705 (e.g., and hence the source of the target cell 703) to the read voltage through terminal DATAB(0). In addition, the decoder connects the target cell drain terminal (e.g., local bitline 704) to ground, and connects a local bitline 717 associated with the drain terminal of an adjacent cell 718 to the precharge voltage, as indicated by the non-directional dashed lines in FIG. 9c. Drain-side sensing is employed to sense the resulting target cell current along the conduction path indicated by the bold dashed directional lines in FIG. 9c. In this fashion, a determination is made as to the data stored in bit 4 of the target memory cell 703 while reducing or mitigating leakage current effects associated with the adjacent cell 718.

Figure 9C:
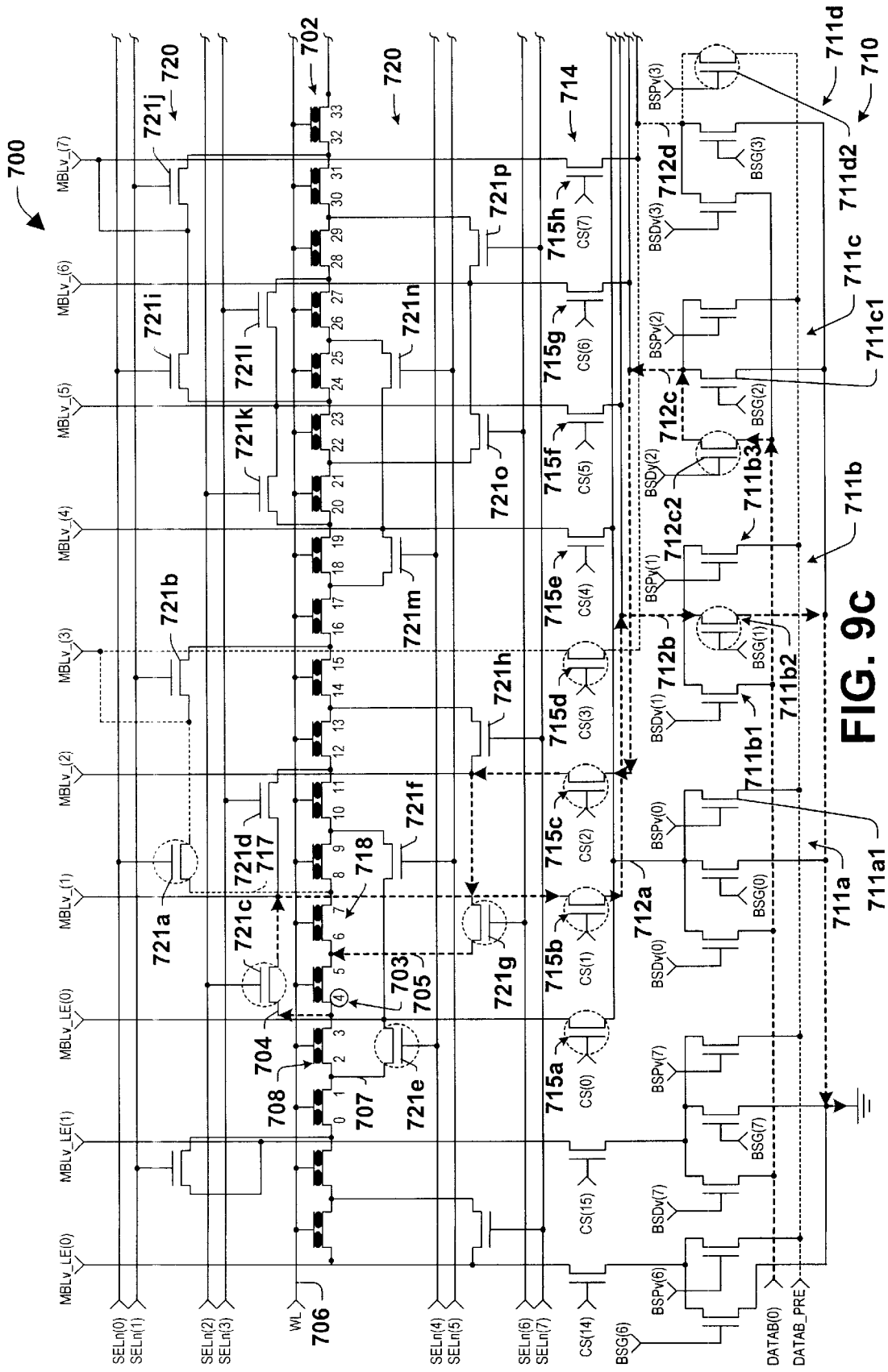
FIG. 9c is a schematic diagram illustrating the memory core of FIGS. 9a and 9b, wherein a second bit of the target dual bit cell is being read in accordance with the present invention.

As illustrated in FIG. 9c and the truth tables 800 and 810 of FIGS. 10 and 11, the decoder provides a byte select switching control signal BSDv(2) to a byte select transistor 711c2 to connect the global bitline 712c to the read voltage, a signal BSG(1) to the byte select transistor 711b2 to connect global bitline 712b to ground, and a signal BSPv(3) to transistor 711d1 to connect the global bitline 712d to the precharge voltage. As illustrated in FIGS. 9c and 12, the decoder further provides column select control signals CS(1)–CS(3) to activate column select transistor switches 715b–715d, respectively. This connects global bitlines 712b, 712c, and 712d to intermediate bitlines MBLv(1), MBLv(2), and MBLv(3), respectively. Referring to FIGS. 9c and 13, the decoder further activates sector select transistors 712a, 712c, and 712g via sector select decoder control signals SELn(0), SELn(2), and SELn(6) in order to connect the intermediate bitlines MBLv(3), MBLv(1), and MBLv(2) to local bitlines 717, 704, and 705, respectively. The selective activation of the byte select, column select, and sector select transistors thus connects the local bitline 705 (e.g., and hence the source of the target cell 703) to the read voltage, the drain terminal (e.g., local bitline 704) to ground, and the a local bitline 717 associated with the source terminal of the adjacent cell 718 to the precharge voltage to mitigate leakage current effects from cell 718.

Other implementations and decoding schemes are possible within the scope of the present invention, by which adjacent cell leakage currents and the adverse effects associated therewith can be mitigated or avoided. For example, as discussed above in reference to FIGS. 8a–8d, the invention provides decoding for source-side sensing configurations as well as those employing drain-side sensing. In addition, the invention can be applied to multiple bit virtual ground architectures (e.g., employing the dual bit cells 702 of FIGS. 9a–9c), as well as to single bit cells in a virtual ground configuration. Thus, the invention can be employed in association with reading any type of virtual ground memory organization, in order to mitigate or avoid the adverse effect of adjacent or neighboring cell leakage current during memory read operations.

Figure 14:
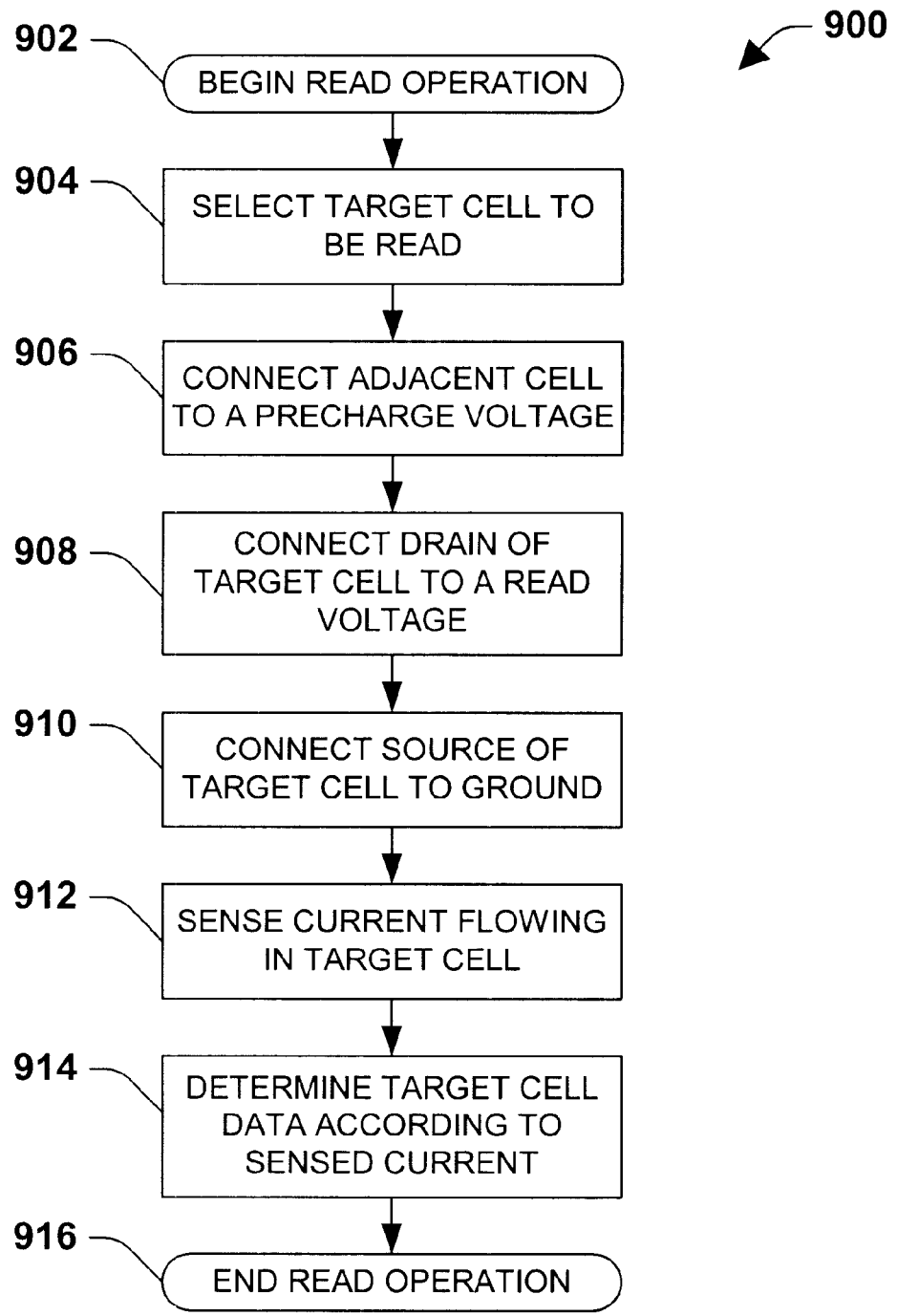
FIG. 14 is a flow diagram illustrating an exemplary method of reading a memory cell in accordance with another aspect of the invention.

Referring now to FIG. 14, another aspect of the invention involves methods for reading memory cells in a virtual ground memory device. One such method 900 is illustrated in FIG. 14 in accordance with the invention. While the exemplary method 900 is illustrated and described herein as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the method 900 may be implemented in association with the apparatus and systems illustrated and described herein as well as in association with other systems not illustrated.

The method 900 begins at 902, after which a target cell to be read is selected at 904. The selection of one or more such target cells of interest may be done according to address lines associated with the memory device. Thus, for instance, the target cell 602 in FIGS. 8a–8d may be selected for reading a data bit stored therein. At 906, a memory cell adjacent to the target cell is connected to a precharge voltage. The adjacent cell to be precharged can be selected according to various criteria, for instance, depending on which bit of a dual bit cell is being read, and/or whether source-side or drain-side sensing is employed. The drain of the target cell is connected to a read voltage at 908 and the source terminal is connected to ground at 910 in order to cause a cell current to flow in the target cell. At 912, the cell current is sensed and the target cell is determined at 914 according to the sensed cell current, whereafter the method 900 ends at 916.

It will be appreciated that in various memory devices, such as a dual bit device, the read voltage can alternatively be connected to the target cell source at 908 and the drain can alternatively be grounded at 914, depending on which bit is to be read. In addition, it will be noted that the precharging of an adjacent memory cell can be performed prior to or simultaneously with the connection of the target cell terminals with the read voltage and ground in accordance with the present invention. The exemplary method 900 and other methods according to the invention thus provide for precharging an adjacent cell in order to facilitate error-free reading of a target cell in a virtual ground memory array by mitigate the leakage current associated with such an adjacent cell.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A flash memory device, comprising:
   a memory core having a plurality of core memory cells organized in a virtual ground configuration;
   a first cell in the memory core having a gate terminal connected to a wordline, a drain terminal connected to a first bitline, and a source terminal connected to a second bitline;
   a second cell in the memory core with a gate connected to the wordline, a drain terminal connected to the second bitline, and a source terminal connected to a third bitline;
   a third cell in the memory core with a gate connected to the wordline, a drain terminal connected to the third bitline, and a source terminal connected to a fourth bitline; and
   a decoder operatively connected to the memory core to precharge one of the first and third cells to a non-zero precharge voltage while sensing data stored in the second cell during a read operation associated with the second cell.

2. The flash memory device of claim 1, wherein the decoder comprises:

a first switch operative to selectively connect the first bitline to a first one of a drain read voltage, the non-zero precharge voltage, and a ground during the read operation associated with the second cell;

a second switch operative to selectively connect the second bitline to a second one of the drain read voltage, the non-zero precharge voltage, and the ground during the read operation associated with the second cell; and a third switch operative to selectively connect the third bitline to a third one of the drain read voltage, the non-zero precharge voltage, and the ground during the read operation associated with the second cell.

3. The flash memory device of claim 2, wherein the decoder further comprises a fourth switch operative to selectively connect the fourth bitline to one of the drain read voltage, the precharge voltage, and the ground during the read operation associated with the second cell.

4. A flash memory device, comprising:

a memory core having a plurality of core memory cells organized in a virtual ground configuration;

a first cell in the memory core having a gate terminal connected to a wordline, a drain terminal connected to a first bitline, and a source terminal connected to a second bitline;

a second cell in the memory core with a gate connected to the wordline, a drain terminal connected to the second bitline, and a source terminal connected to a third bitline;

a third cell in the memory core with a gate connected to the wordline, a drain terminal connected to the third bitline, and a source terminal connected to a fourth bitline; and a decoder operatively connected to the memory core to precharge one of the first and third cells during a read operation associated with the second cell;

wherein the decoder comprises:

a first switch operative to selectively provide a precharge voltage to the first bitline during the read operation associated with the second cell;

a second switch operative to selectively connect the second bitline to a first one of a drain read voltage and a ground during the read operation associated with the second cell; and a third switch operative to selectively connect the third bitline to a second one of the drain read voltage, and the ground during the read operation associated with the second cell.

5. The flash memory device of claim 4, wherein the second switch connects the second bitline to the drain read voltage through a current sensor and the third switch connects the third bitline to the ground during the read operation associated with the second cell.

6. The flash memory device of claim 4, wherein the second switch connects the second bitline to the ground through a current sensor and the third switch connects the third bitline to the drain read voltage during the read operation associated with the second cell.

7. The flash memory device of claim 4, wherein the decoder further comprises a fourth switch operative to selectively provide the precharge voltage to the fourth bitline during the read operation associated with the second cell.

8. The flash memory device of claim 7, wherein second switch connects the second bitline to the drain read voltage and the third switch connects the third bitline to the ground through a current sensor during the read operation associated with the second cell.

9. The flash memory device of claim 7, wherein the second switch connects the second bitline to the ground and the third switch connects the third bitline to the drain read voltage through a current sensor during the read operation associated with the second cell.

10. The flash memory device of claim 4, wherein the decoder further comprises a fourth switch operative to selectively provide the precharge voltage to the fourth bitline during the read operation associated with the second cell, wherein the decoder selectively provides the precharge voltage to one of the first and fourth bitlines using one of the first and fourth switches, respectively, during the read operation associated with the second cell.

11. The flash memory device of claim 10, wherein the decoder connects the drain read voltage to the second bitline through a current sensor using the second switch, connects the third bitline to the ground using the third switch, and connects the precharge voltage to the first bitline using the first switch during the read operation associated with the second cell.

12. The flash memory device of claim 10, wherein the decoder connects the drain read voltage to the second bitline using the second switch, connects the third bitline to the ground through a current sensor using the third switch, and connects the precharge voltage to the fourth bitline using the fourth switch during the read operation associated with the second cell.

13. The flash memory device of claim 10, wherein the decoder connects the drain read voltage to the third bitline through a current sensor using the third switch, connects the second bitline to the ground using the second switch, and connects the precharge voltage to the fourth bitline using the fourth switch during the read operation associated with the second cell.

14. The flash memory device of claim 10, wherein the decoder connects the drain read voltage to the third bitline using the third switch, connects the second bitline to the ground through a current sensor using the second switch, and connects the precharge voltage to the first bitline using the first switch during the read operation associated with the second cell.

15. The flash memory device of claim 4, wherein the second cell comprises a dual bit memory cell having first and second data bits, and wherein the decoder connects the drain read voltage to the second bitline using the second switch, connects the third bitline to the ground using the third switch, and connects the precharge voltage to the first bitline using the first switch while reading the first data bit of the second cell.

16. The flash memory device of claim 15, wherein the decoder connects the second bitline to the ground using the second switch and connects the drain read voltage to the third bitline using the third switch, and wherein the decoder further comprises a fourth switch operative to connect the precharge voltage to the fourth bitline while reading the second data bit of the second cell.

17. The flash memory device of claim 10, wherein the first, second, third, and fourth switches individually comprise a column select switch, a byte select switch and sector select switch, and wherein the decoder selectively provides control signals to the column select, byte select and sector select switches to selectively connect the first, second, third, and fourth bitlines to one of the drain read voltage, the precharge voltage, and the ground during the read operation.

18. A method of reading a memory cell in a memory core having a first cell with a drain terminal connected to a first bitline, and a source terminal connected to a second bitline, a second cell with a drain terminal connected to the second bitline, and a source terminal connected to a third bitline, and a third cell with a drain terminal connected to the third bitline, and a source terminal connected to a fourth bitline, the method comprising:

selecting the second cell to be read;

precharging one of the first and third cells; and reading the second cell while precharging the one of the first and third cells.

19. A method of reading a memory cell in a memory core having a first cell with a drain terminal connected to a first bitline, and a source terminal connected to a second bitline, a second cell with a drain terminal connected to the second bitline, and a source terminal connected to a third bitline, and a third cell with a drain terminal connected to the third bitline, and a source terminal connected to a fourth bitline, the method comprising:

selecting the second cell to be read;

precharging one of the first and third cells; and reading the second cell;

wherein reading the second cell comprises:

connecting the second bitline to a first one of a drain read voltage and a ground; and connecting the third bitline to a second one of the drain read voltage and the ground.

20. The method of claim 19, wherein precharging the one of the first and third cells comprises connecting one of the first and fourth bitlines to a precharge voltage.

* * * * *

UNITED STATES PATENT AND TRADEMARK OFFICE
CERTIFICATE OF CORRECTION

PATENT NO. : 6,525,969 B1
DATED : February 25, 2003
INVENTOR(S) : Kazuhiro Kurihara and Santosh K. Yachareni It is certified that error appears in the above-identified patent and that said Letters Patent is hereby corrected as shown below:

Column 13,
Line 2, please replace the word "DATAB$_{13}$PRE" with the word -- DATAB_PRE --.

Column 17,
Lines 13-17, should read:
    3. The flash memory device of claim 2, wherein the decoder further comprises a fourth switch operative to selectively connect the fourth bitline to one of the drain read voltage, the non-zero precharge voltage, and the ground during the read operation associated with the second cell.

Signed and Sealed this

First Day of July, 2003

JAMES E. ROGAN
*Director of the United States Patent and Trademark Office*